(12) United States Patent
Shinomiya et al.

(10) Patent No.: US 6,336,207 B2
(45) Date of Patent: *Jan. 1, 2002

(54) METHOD AND APPARATUS FOR DESIGNING LSI LAYOUT, CELL LIBRARY FOR DESIGNING LSI LAYOUT AND SEMICONDUCTOR INTEGRATED CIRCUIT

(75) Inventors: Noriko Shinomiya; Masahiro Fukui, both of Osaka (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/084,019

(22) Filed: May 26, 1998

(30) Foreign Application Priority Data

May 27, 1997 (JP) .............................................. 9-136818

(51) Int. Cl.$^7$ ............................................ G06F 17/50
(52) U.S. Cl. ................................. 716/11; 716/2; 716/3; 716/8
(58) Field of Search ........................................ 716/1–18

(56) References Cited

U.S. PATENT DOCUMENTS

| | | | | |
|---|---|---|---|---|
| 4,580,228 A | * | 4/1986 | Noto | 364/491 |
| 5,349,542 A | * | 9/1994 | Brasen et al. | 364/578 |
| 5,404,310 A | * | 4/1995 | Mitsuhashi | 364/490 |
| 5,537,328 A | * | 7/1996 | Ito | 364/489 |
| 5,602,753 A | * | 2/1997 | Fukui | 364/459 |

(List continued on next page.)

FOREIGN PATENT DOCUMENTS

| | | |
|---|---|---|
| JP | 62-169445 | 7/1987 |
| JP | 01286079 | 11/1989 |
| JP | 03023651 | 1/1991 |
| JP | 03062551 | 3/1991 |
| JP | 04129247 | 4/1992 |

(List continued on next page.)

OTHER PUBLICATIONS

S. Chowdhury, An Automated Design of Minimum–Area IC Power/Ground Nets, 24th ACM/IEEE Design Automation Conference Proceedings, pp. 223–229, Jun. 1987.*

Y. Tsujihashi et al., A High–Density Data–Path Generator with Stretchable Cells, IEEE Journal of Solid–State Circuits, pp. 2–8, Jun. 1994.*

S. Lin, et al., "delay and Area Optimization in Standard–Cell Design", Proc. of 27$^{th}$ ACM/IEEE Design Automation Conference, 1990, pp. 349–352.

Primary Examiner—Caridad Everhart
Assistant Examiner—A. M. Thompson
(74) Attorney, Agent, or Firm—McDermott, Will & Emery

(57) ABSTRACT

Method and apparatus for suppressing change in wiring delay time resulting from cell interchange and thereby satisfying required specifications in a short period of time with certainty during LSI layout designing. Cells are arranged in parallel to each other and routed based on circuit designing information, thereby designing a block layout including a plurality of cell rows. A cell not satisfying the required specifications is extracted from the block layout, and a level of drivability required for the cell to satisfy the required specifications is calculated. The extracted cell in question is interchanged with a substitute cell. The substitute cell has equivalent logic, a required level of drivability and the same width and terminal position in the cell arrangement direction reaction a cell row as the counterparts of the cell in question and is provided in a stretchable cell library.

19 Claims, 18 Drawing Sheets

U.S. PATENT DOCUMENTS

| | | | | |
|---|---|---|---|---|
| 5,638,294 A | * | 6/1997 | Sasada | 364/491 |
| 5,663,662 A | * | 9/1997 | Kurosawa | 326/41 |
| 5,666,288 A | * | 9/1997 | Jones et al. | 364/490 |
| 5,724,250 A | * | 3/1998 | Kerzman et al. | 364/488 |
| 5,764,525 A | * | 6/1998 | Mahmood et al. | 364/488 |
| 5,768,146 A | * | 6/1998 | Jassowski | 364/491 |
| 5,796,299 A | * | 8/1998 | Sei et al. | 327/565 |
| 5,801,960 A | * | 9/1998 | Takano et al. | 364/491 |
| 5,852,562 A | * | 12/1998 | Shinomiya et al. | 364/491 |
| 6,000,829 A | * | 12/1999 | Kurokawa et al. | 364/468.01 |

FOREIGN PATENT DOCUMENTS

| | | |
|---|---|---|
| JP | 05326705 | 12/1993 |
| JP | 06085062 | 3/1994 |
| JP | 06140505 | 5/1994 |
| JP | 07014927 | 1/1995 |
| JP | 07086409 | 3/1995 |
| JP | 07249747 | 9/1995 |
| JP | 08167652 | 6/1996 |
| JP | 8-147341 | 7/1996 |
| JP | 10107152 | 4/1998 |

* cited by examiner

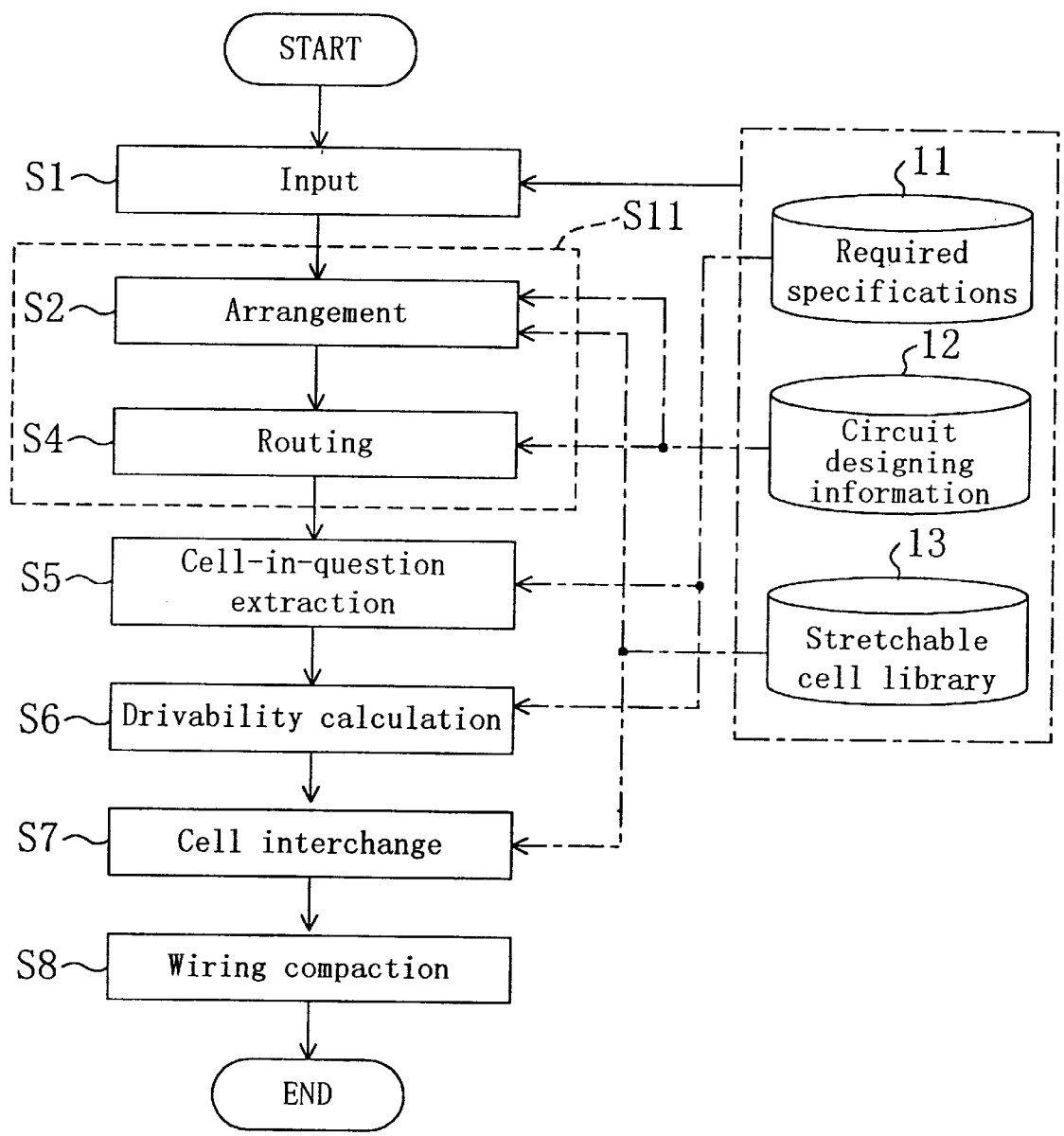

METHOD AND APPARATUS FOR DESIGNING LSI LAYOUT, CELL LIBRARY FOR DESIGNING LSI LAYOUT AND SEMICONDUCTOR INTEGRATED CIRCUIT

BACKGROUND OF THE INVENTION

The present invention relates to technology for designing an LSI layout. More particularly, the present invention relates to LSI layout designing technology, in which cells are interchanged in such a manner as to satisfy required specifications about timing, power consumption and the like.

FIG. 16 is a flow chart illustrating the processing procedure of a conventional LSI layout designing method in accordance with standard cell processing.

In input processing S51, required specifications 51 about timing, power consumption and the like, circuit designing information 52 obtained by logical designing and a cell library 53 are input.

FIG. 17 is a schematic representation diagrammatically illustrating the cell library 53 for use in conventional LSI layout designing. In the cell library 53, a plurality of cells having such logic functions as required for operating an LSI are provided. Among these cells, there are some cells having equivalent logic but different transistor sizes, i.e., different levels of drivability (e.g., output current and output voltage).

In conventional standard cell processing in general, a restriction is imposed on cells that the cells have an equal height. On the other hand, no restriction is imposed on the widths of the cells, which may be set at arbitrary values. Accordingly, when there are cells having equivalent logic and mutually different levels of drivability, a cell having a larger level of drivability tends to be designed to have a larger cell width.

In FIG. 17, cells 61A, 61B and 61C are logically equivalent cells (implemented as inverters), the levels of drivability of which increase in the order of 61A<61B<61C. More specifically, the cells 61A, 61B and 61C have an equal height but mutually different widths, which increase in the order of 61A<61B<61C. Similarly, cells 62A, 62B, and 62C are logically equivalent cells (implemented as two-input AND gates), the levels of drivability of which increase in the order of 62A<62B<62C. Similarly, the cells 62A, 62B and 62C also have an equal height but mutually different widths, which increase in the order of 62A<62B<62C.

Referring back to FIG. 16, in arrangement processing S52, a plurality of cells are selected from the cell library 53 and two-dimensionally arranged in parallel on a plane based on the circuit designing information 52. Then, a block layout, including a plurality of cell rows arranged in parallel, is designed. In routing processing S53, the cells are wired with each other based on the circuit designing information 52.

FIG. 18A illustrates an exemplary block layout designed in accordance with the arrangement processing S52 and the routing processing S53. As shown in FIG. 18A, three cell rows 73a, 73b and 73c are arranged in a block 70. Each of the rows 73a, 73b and 73c includes a plurality of cells 71. The reference numeral 72 denotes a terminal of the cell 71 and the reference numeral 74 denotes a wire connecting two terminals 72 together. If complete routing cannot be performed only over on-cell regions (i.e., areas directly above the cells), then pure wiring regions 75a and 75b dedicated entirely for wiring are provided between adjacent rows, and the routing is completed by using these regions 75a and 75b.

FIG. 16 will be referred to again. In cell-in-question extraction processing S54, a cell including a circuit section failing to satisfy the required specifications is extracted as a cell to be interchanged with an appropriate cell (in this specification, such a cell will be referred to as a "cell in question"). Herein, assume a delay restriction is imposed on each net. Then, the delay time of each net is calculated based on the delay parameter information of a cell driving the net and a cell at the next stage, which both are included in the cell library 53, and on the routing results of the routing processing S53. If the calculated delay time fails to satisfy the delay restriction, then the cell driving the net is extracted as a cell in question. As shown in FIG. 18A, the cell in question is identified by hatching, i.e., a cell 76A.

In drivability calculation processing S55, it is calculated what level of drivability is required for the cell in question, which has been extracted through the cell-in-question extraction processing S54, to satisfy the required specifications.

The delay time Td of a net is given by the following equation:

$$Td = Tin + Tld + Tw + Tp \quad (1)$$

where Tin denotes gate intrinsic delay, Tld denotes an over-all load (i.e., a sum of wiring capacitance and the capacitance of the input terminal of a gate on the next stage), Tw denotes wiring delay and Tp denotes delay dependent on the blurred waveform (i.e., a signal having rising and falling edges exhibiting a less sharp shape than the previous signal) of the previous stage.

If the drivability of a cell is varied, then the gate intrinsic delay Tin and the overall load Tld vary but the wiring delay Tw and the delay Tp dependent on the blurred waveform of the previous stage do not vary. The wiring delay Tw is calculated based on the routing designed in accordance with the routing processing S53. By using this equation, the drivability of a cell is calculated in such a way that the delay time Td of a net satisfies the restriction thereof.

In cell interchange processing S56, the cell in question is replaced with a cell having such a level of drivability as calculated in accordance with the drivability calculation processing S55.

The conventional LSI layout designing supposes the use of a cell library 53 such as that shown in FIG. 17. Thus, if a cell in question is interchanged with a cell having a larger level of drivability, then the substitute cell sometimes overlaps with an adjacent cell, because the cell has a larger cell width. Conversely, if a cell in question is interchanged with a cell having a smaller level of drivability, then a gap is unintentionally produced between the substitute cell and an adjacent cell. In order to eliminate such overlap and gap, some cells belonging to the same row need to be relatively moved in the cell row direction. However, if the cells are moved in such a manner, the terminal positions of the cells are also moved to deviate from the originally intended positions determined in the routing processing S52.

FIG. 18B shows a resultant arrangement in which the cell in question 76A shown in FIG. 18A has been interchanged with a logically equivalent cell 76B having a larger level of drivability. Since the cell 76B has a width larger than that of the cell 76A, the cells located on the right-hand side of the cell 76B on the same row 73b need to be moved to the right in order to prevent the cell 76B from overlapping the adjacent cell. As a result, the positions of the terminals 72 shown in FIG. 18B have also changed by comparison with FIG. 18A. Also, since the cell row 73b becomes longer than that of any other row 73a, 73c, the resultant width of the block 70 increases and dead spaces, where no cells are disposed, are produced on the right-hand side of the rows 73a and 73c. The cell-in-question extraction processing S54, the drivability calculation processing S55 and the cell interchange processing S56 are disclosed, for example, in Shen Lin et al., "Delay and Area optimization in Standard-Cell Design", 1990 Design Automation Conference, which is herein incorporated by reference.

Referring back to FIG. 16, in re-routing processing S57, routing is performed again with respect to the terminals moved to different positions. FIG. 18B also shows the results of the re-routing processing S57. As can be understood from the comparison between FIGS. 18A and 18B, the wiring routes have also changed. In this case, the height of the block 70 sometimes changes as a result of the re-routing processing S57.

On the other hand, in accordance with conventional LSI layout designing, circuit designing is once performed by using cells having relatively larger levels of drivability to allow a sufficient margin for timing. Then, by using a delay time obtained after the arranging/routing processing has been performed for the layout designing, some of the cells are interchanged with cells having smaller levels of drivability so as to satisfy the timing requirement and thereby reduce the resulting power consumption.

However, the conventional LSI layout designing has the following problems.

First, as already described, if the cell interchange processing is performed so as to satisfy the required specifications in accordance with the conventional method, then the terminal positions of the cells unintentionally move from those defined in the originally designed arrangement. Thus, re-routing processing needs to be performed, and therefore, the overall processing time of the layout designing becomes adversely lengthy.

In addition, since the wiring routes drastically change as a result of the re-routing processing, an actual wiring delay time greatly deviates from the time estimated for the initial arrangement. In general, the propagation delay time of an LSI is given as a sum of a gate delay time and a wiring delay time. However, as the size of an LSI is miniaturized, the proportion of the wiring delay time to the entire propagation delay time more and more increases. Thus, such an erroneously estimated wiring delay time will cause a non-negligible serious problem.

The wiring delay time is varied as a result of the re-routing processing because of the following two reasons. For one thing, the length of a wire changes. The other factor is variation in wiring capacitance between adjacent wires because the positional interrelation between wires changes owing to the change of the wiring routes.

In particular, the change of the wiring delay time, resulting from the variation in capacitance between adjacent wires, becomes more significant as the size of an LSI is further miniaturized. This is because the proportion of the capacitance between adjacent wires with respect to the entire wiring capacitance tends to increase as an LSI is downsized. Thus, even slight change of the wiring routes brings about drastic change of a wiring delay time.

Owing to the change of the wiring delay time resulting from the variation in capacitance between adjacent wires, it is extremely difficult to secure required specifications such as timing restriction by performing cell interchange processing only once. The rationale is as follows. Even when the drivability of a cell is defined in accordance with Equation (1) so as to satisfy the required specifications, the required specifications are not always satisfied because the wiring delay Tw of Equation (1) changes as a result of the re-routing processing. Thus, redundant processing, such as the repetition of cell interchange processing, needs to be performed. Consequently, the overall processing time of the LSI layout designing disadvantageously increases.

SUMMARY OF THE INVENTION

An object of the present invention is to satisfy required specifications in a short processing time with certainty by suppressing change in wiring delay time resulting from cell interchange during LSI layout designing.

Specifically, the LSI layout designing method of the present invention includes a step of interchanging a cell in question with a substitute cell in a block layout including a plurality of cell rows and being designed based on circuit designing information so as to satisfy required specifications. The cell rows are arranged in parallel to each other. In the interchanging step, the cell in question is interchanged with the substitute cell by using a stretchable cell library as a cell library constituting a set of cells to be arranged. Cells in the stretchable cell library, which have equivalent logic and different levels of drivability, are provided with such a cell layout that widths and terminal positions of the cells are equal to each other in a cell arrangement direction on each said row.

According to the present invention, when a cell in question is interchanged with a cell having a required level of drivability for satisfying the required specifications through the cell interchange, the widths and terminal positions in the cell arrangement direction on each cell row do not change before and after the cell interchange. Thus, since the wiring routes used for the block layout before the cell interchange can be used as it is as part of the results of layout designing, there is no need to perform re-routing. In addition, since the positional interrelation between the wires does not change through the cell interchange either, the change in wiring delay time resulting from the cell interchange is considerably smaller as compared with a conventional case. Accordingly, the required specifications can be satisfied by performing a cell interchange only once. Consequently, the required specifications can be satisfied with certainty in a short processing time.

The present invention also provides an LSI layout designing apparatus for implementing the LSI layout designing method.

Moreover, the present invention provides a computer readable recording medium in which a program for implementing the LSI layout designing method is recorded.

Furthermore, the present invention provides a computer readable recording medium in which a stretchable cell library used for implementing the LSI layout designing method is recorded.

Also, the present invention provides a semiconductor integrated circuit designed in accordance with the LSI layout designing method. The semiconductor integrated circuit includes a plurality of cells that are arranged along a pair of power lines. At least part of the cells are formed so as to cover a region between the pair of power lines and regions outside of the region between the power lines. Intra-cell wiring of each said cell is formed in a part of a predetermined wiring layer located in a first on-cell wiring region. The first on-cell wiring region is located in the region between the power lines. Other parts of the predetermined wiring layer, located in second on-cell wiring regions, are used for inter-cell wiring. The second on-cell wiring regions are located in regions outside of the region between the power lines.

BRIEF DESCRIPTION OF THE DRAWINGS

FIG. 4A is a diagram illustrating an exemplary block layout designed through arrangement processing S2; and FIG. 4B is a diagram illustrating a process during which pure wiring region providing processing S3 is performed on the layout shown in FIG. 4A.

FIG. 5A is a diagram illustrating the results of routing processing S4 performed on the layout shown in FIG. 4A; and FIG. 5B is a diagram illustrating the results of cell interchange processing S7 performed on the layout shown in FIG. 5A.

FIG. 7 is a flow chart illustrating a processing procedure of an LSI layout designing method in the second embodiment of the present invention.

FIG. 8A is a diagram illustrating an exemplary block layout designed through arranging/routing processing; and FIG. 8B is a diagram illustrating the results of cell interchange processing S7 and wiring compaction processing S8 performed on the layout shown in FIG. 8A.

FIG. 10A is a diagram illustrating an exemplary block layout designed through arranging/routing processing; and FIG. 10B is a diagram illustrating the results of wiring compaction processing S8 performed on the layout shown in FIG. 10A.

FIG. 12A is a diagram illustrating an exemplary layout before the drivability calculation processing S6 is performed; and FIGS. 12B and 12C are diagrams illustrating exemplary layouts in which different levels of drivability are assigned to the respective cells in question in the layout shown in FIG. 12A.

FIG. 14A is a diagram illustrating a block layout after the cell interchange processing has been performed; and FIG. 14B is a diagram illustrating a circuit model used for analyzing the voltage drop corresponding to the layout shown in FIG. 14A.

FIG. 18A is a diagram illustrating an exemplary block layout before cell interchange processing S56 is performed; and FIG. 18B is a diagram illustrating an exemplary block layout after the cell interchange processing S56 has been performed on the block layout shown in FIG. 18A.

DESCRIPTION OF PREFERRED EMBODIMENTS

In the LSI layout designing method of the present invention, a cell in question is interchanged with a cell having equivalent logic and such drivability as satisfying the required specifications. The cells are interchanged under the condition that the widths and the terminal positions of the cells in the cell arrangement direction on each of the cell rows arranged in parallel do not change. Under this condition, the present invention does not substantially change the wiring delay time, even if the cells are interchanged to satisfy the required specifications.

In this specification, the size of a cell or block in the direction in which cells are arranged in parallel on a row (i.e., the cell arrangement direction) is regarded as a width, and the size thereof in the direction vertical to the cell arrangement direction is regarded as a height.

Hereinafter, the present invention will be described with reference to the accompanying drawings.

Embodiment 1

Figure 1:
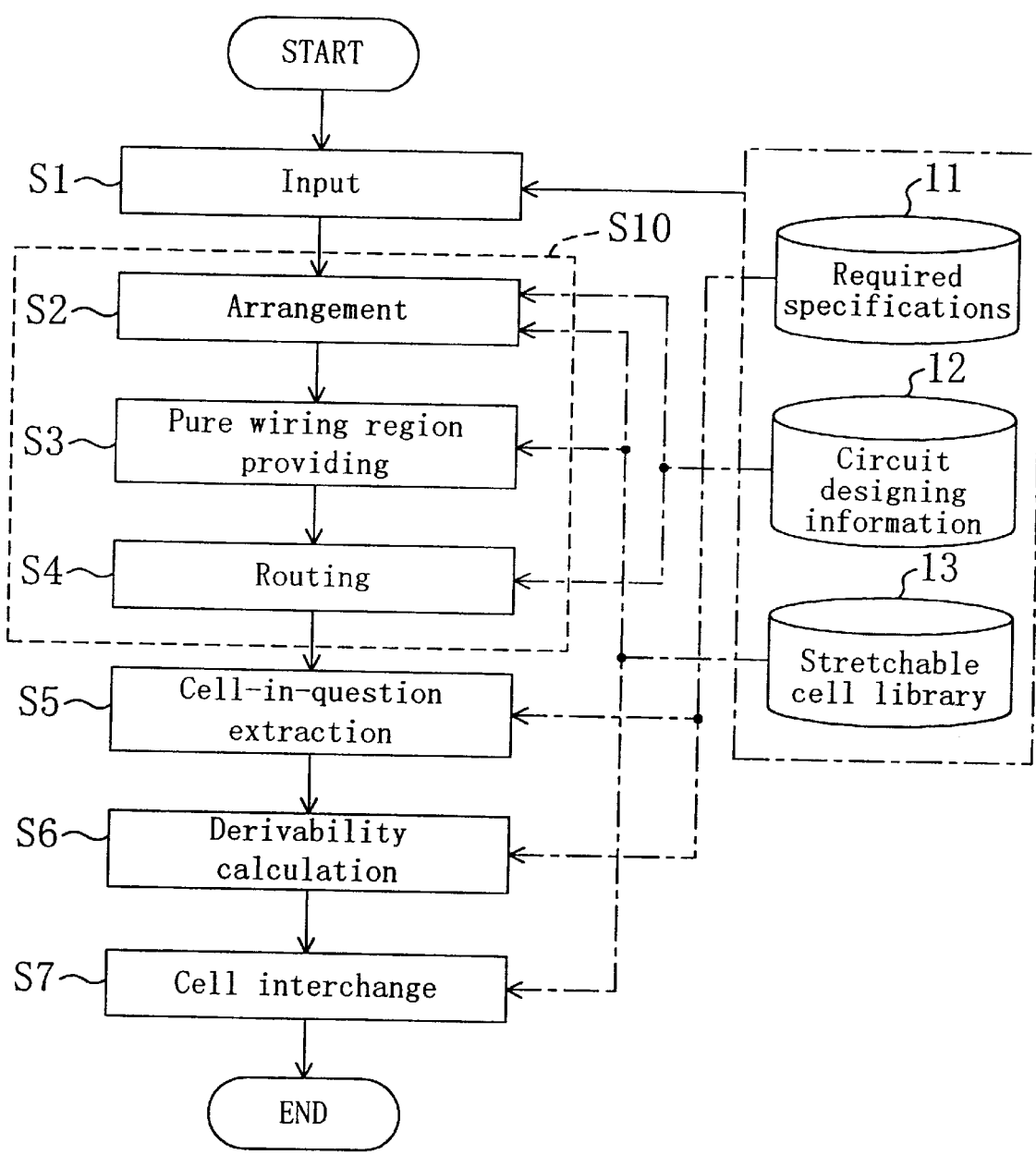
FIG. 1 is a flow chart illustrating a processing procedure of an LSI layout designing method in the first embodiment of the present invention.

FIG. 1 is a flow chart illustrating the processing procedure of an LSI layout designing method in the first embodiment of the present invention.

First, in input processing S1, required specifications for an LSI to be designed and circuit designing information 12 obtained for the LSI through logical designing are input. The required specifications 11 include, for example, timing requirement and power consumption requirement. The timing requirement is represented as conditions restricting the delay times of a net (i.e., a set of wires and cells on the next stage to be driven by a single cell) and a path (i.e., a set of cells and wires on a route). The power consumption requirement is set so as to reduce power consumption as much as possible while satisfying the timing requirement. The circuit designing information 12 is provided as a net list representing the routing information among the cells by describing the names of cells, terminals and signals. If the same signal name is designated for two terminals, the terminals should be interconnected with each other via a wire during the layout designing.

In the input processing S1, a cell library 13 is also input. A cell library is a set including: circuit information representing transistor sizes and connection information of cells implementing various logic functions used during LSI designing at transistor level; the layout of cells implementing this circuit at the transistor level; and parameter information about delay, power consumption and so forth.

In this embodiment, a cell library, in which cells having equivalent logic and different levels of drivability are provided with such a cell layout that the widths and terminal position of these cells are equal to each other, is used as the cell library 13. In this specification, the cell library 13 having such a feature will be referred to as a "stretchable cell library" so as to be distinguishable from a conventional cell library.

Figure 2:
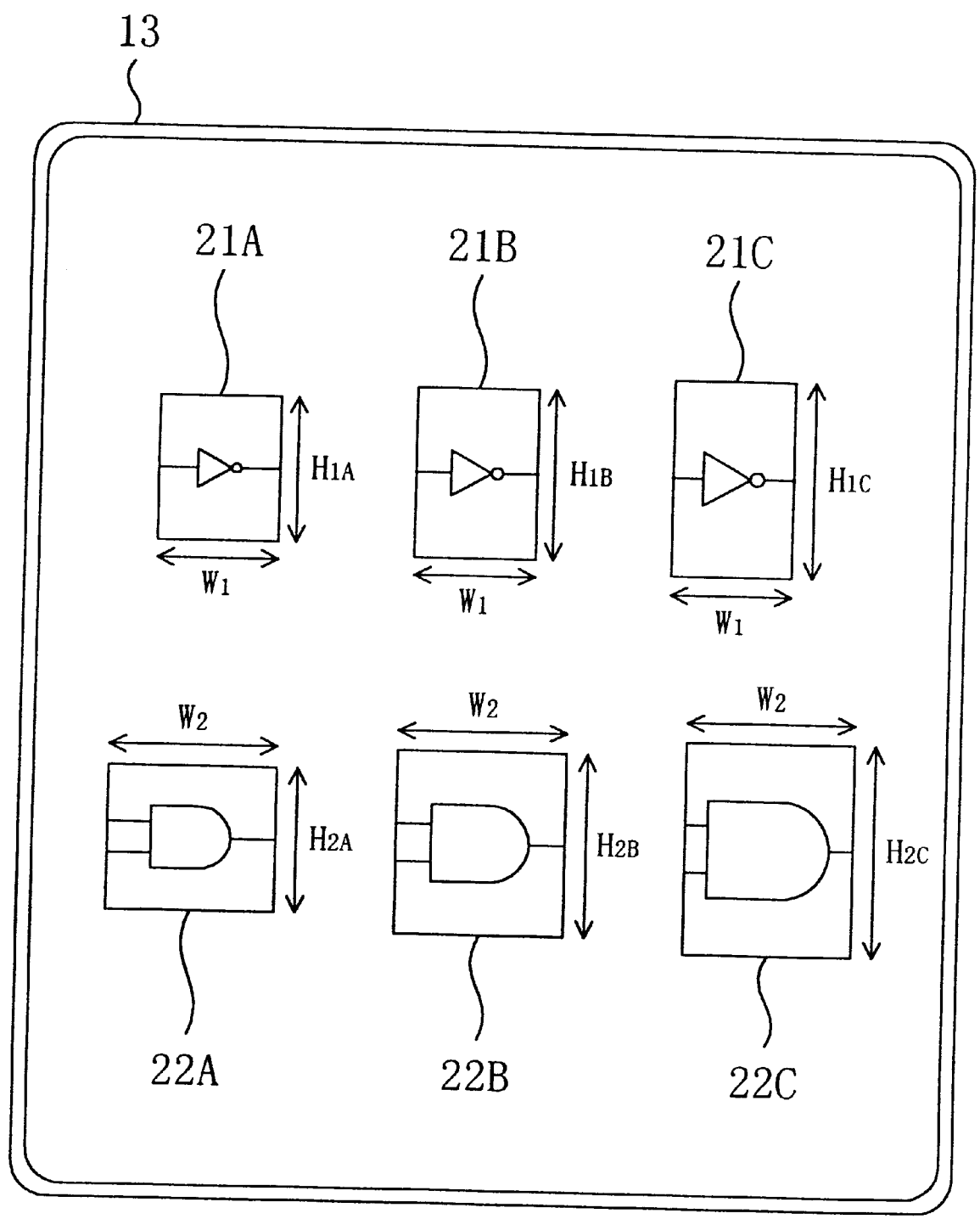
FIG. 2 is a schematic representation diagrammatically illustrating a stretchable cell library used in the respective embodiments of the present invention.

FIG. 2 is a schematic representation diagrammatically illustrating the stretchable cell library 13. In FIG. 2, cells (inverters) 21A, 21B and 21C have equivalent logic and different levels of drivability. The heights of the cells 21A, 21B and 21C are different from each other, and the levels of drivability thereof increase in the order of 21A<21B<21C. However, the cells 21A, 21B and 21C all have the same width of W1. Cells (two-input AND gates) 22A, 22B and 22C also have equivalent logic and different levels of drivability. Similarly, the heights of the cells 22A, 22B and 22C are different from each other, and the levels of drivability thereof increase in the order of 22A<22B<22C. However, the cells 22A, 22B and 22C all have the same width of W2.

Figure 3A:
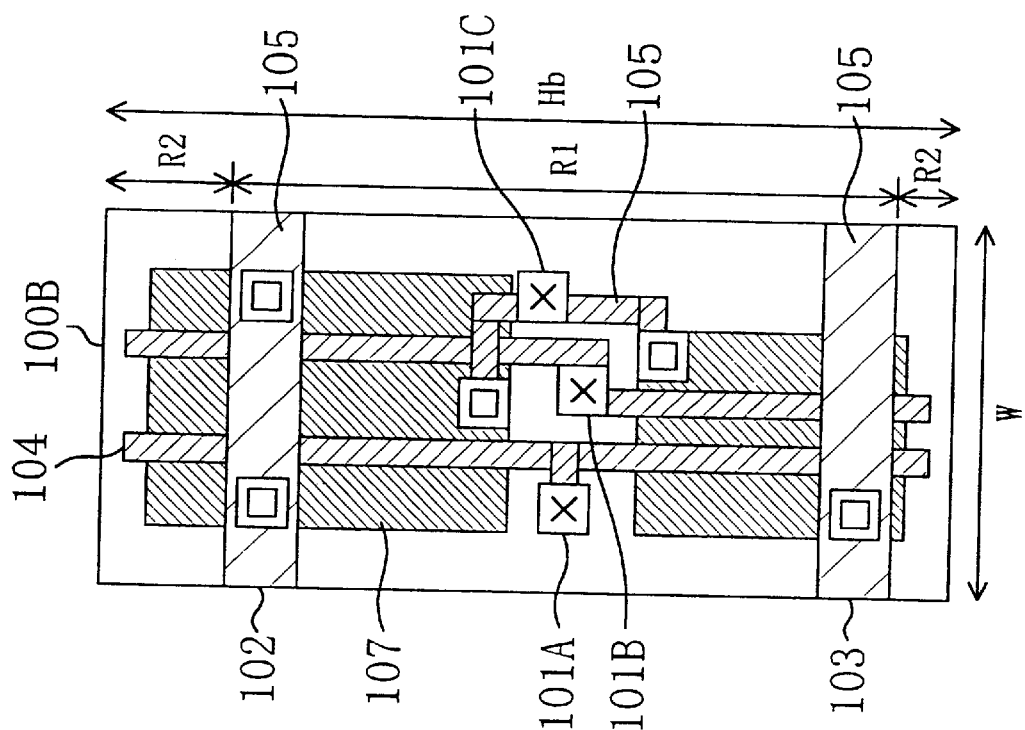
FIGS. 3A and 3B are diagrams illustrating exemplary layouts of the cells included in the stretchable cell library, in which the cells have equivalent logic and different levels of drivability.
Figure 3B:
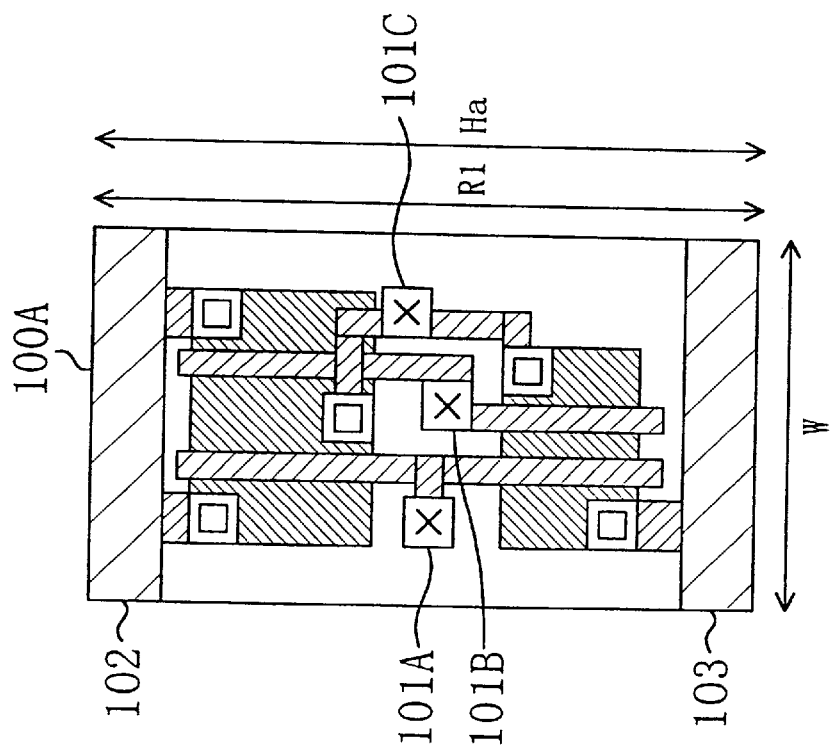

FIGS. 3A and 3B are diagrams illustrating exemplary layouts of the cells included in the stretchable cell library 13. Specifically,. FIG. 3A shows the layout of a cell 100A and FIG. 3B shows the layout of a cell 100B designed in such a manner as to have equivalent logic to that of the cell 100A and a higher level of drivability than that of the cell 100A. In FIGS. 3A and 3B, the reference numerals 101A, 101B and 101C denote terminals, the reference numeral 102 denotes a power supply line and 103 denotes a ground line. In this specification, the power supply line and the ground line will sometimes be called "power lines" collectively.

In the cell layouts shown in FIGS. 3A and 3B, the power supply line 102 and the ground line 103 are formed in a first metal wiring layer 105. The first metal wiring layer 105 is applied not only for the power supply line 102 and the ground line 103, but also for electrodes on a diffusion layer 107 and wires inside and outside of cells. However, wires intersecting with the power supply line 102 and the ground line 103 cannot be formed in the first metal wiring layer 105. A polysilicon wiring layer 104 is formed under the first metal wiring layer 105. In the polysilicon wiring layer 104, gates of transistors are mainly formed. Second and third metal wiring layers (not shown) are further formed over the first metal wiring layer 105. In the second and third metal wiring layers, intra-cell wires and inter-cell wires can be freely formed.

The layout of the cells included in the stretchable cell library 13 has the following two features.

(1) Cells having equivalent logic and different levels of drivability have the same widths and the same terminal positions, but have different heights. As shown in FIGS. 3A and 3B, the cells 100A and 100B have the same width of W, and the terminals 101A, 101B and 101C are located at the same positions as viewed from the power supply line 102 and the ground line 103. On the other hand, the height Hb of the cell 100B is larger than the height Ha of the cell 100A.

(2) The applications of the first metal wiring layer over the cells are restricted in the following manner such that the wires are formed only over the cells as a matter principle and that the change in heights of cells affect the wires:

(a) In a first on-cell wiring region R1 interposed between the power supply line 102 and the ground line 103), the first metal wiring layer is used as intra-cell wiring.

(b) In second on-cell wiring regions R2 (i.e., regions other than the first on-cell wiring region R1), the first metal wiring layer is used as inter-cell wiring.

Referring back to FIG. 1, arranging/routing processing S10 is subsequently performed. In this embodiment, the arranging/routing processing S10 consists of arrangement processing S2, pure wiring region providing processing S3 and routing processing S4.

Figure 4A:
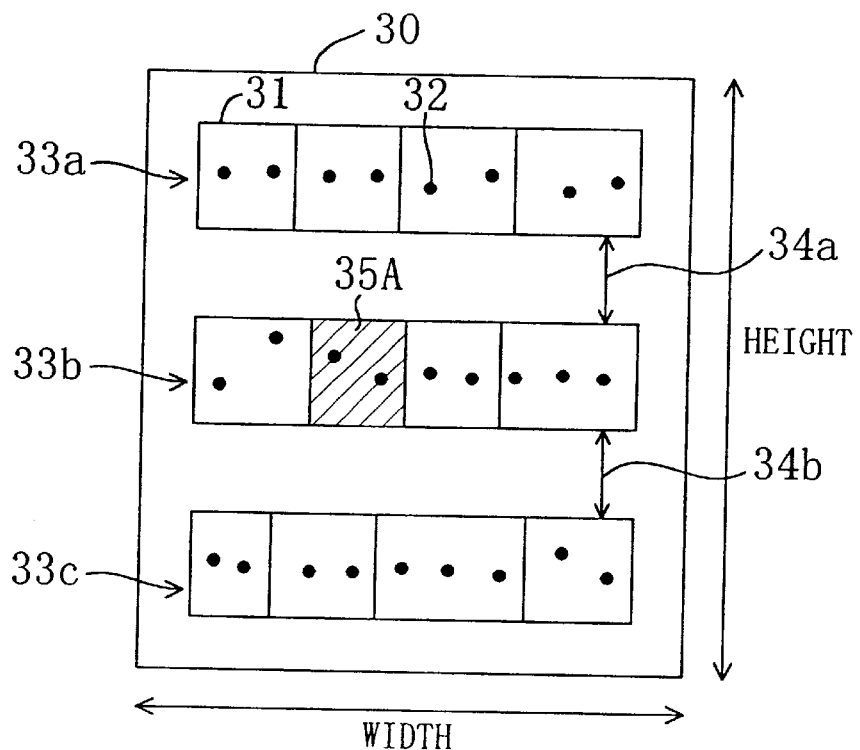
FIGS. 4A and 4B are diagrams illustrating the first embodiment of the present invention.

First, in the arrangement processing S2, cells are selected from the stretchable cell library 13 based on the circuit designing information 12 and two-dimensionally arranged in parallel on a plane, thereby designing a block layout including a plurality of cell rows arranged in parallel. FIG. 4A is a diagram illustrating an exemplary block layout designed through the arrangement processing S2. In the block 30, three rows 3a, 33b and 33c, each consisting of a plurality of cells 31, are arranged. In FIG. 4A, the reference numeral 32 denotes the terminals of the cells 31.

Next, in the pure wiring region providing processing S3, a pure wiring region expanding the gap between adjacent cell rows is provided in the block layout designed through the arrangement processing S2 with reference to the stretchable cell library 13.

The pure wiring regions are provided for the purpose of securing a sufficient gap between cell rows. By providing these regions, even when the height of some cell is increased as a result of the cell interchange processing S7 to be performed later, a design rule error is not generated vertically in a gap between the row including such a cell with an increased height and upper and/or lower adjacent row(s). If such a gap is not provided, the height of the transistors laid out in the cell is increased in the cell height direction because of the increase in height of the cell. As a result, a design rule error such as transistor overlapping in the gap between vertically adjacent cell rows is more likely to be generated.

FIG. 4A shows a pure wiring region 34a provided between cell rows 33a and 33b and a pure wiring region 34b provided between cell rows 33b and 33c. In FIG. 4A, the boundaries of the pure wiring regions in the block width direction are not shown and the pure wiring regions are defined by arrows indicating the length thereof in the block height direction, for the sake of simplicity. The same rule will be applied to the other similar drawings. The length of the each of the pure wiring regions 34a, 34b in the block width direction is set at the length of the longer one of vertically adjacent cell rows thereof.

The length of each of the pure wiring regions in the block height direction is set as follows.

First, the maximum height that each cell row can take after any of the arranged cells has been interchanged as a result of the cell interchange processing S7 is obtained and defined as such. And, based on the maximum height of the cell row, boundary lines representing the upper and lower limits of the cell row are drawn.

Figure 4B:
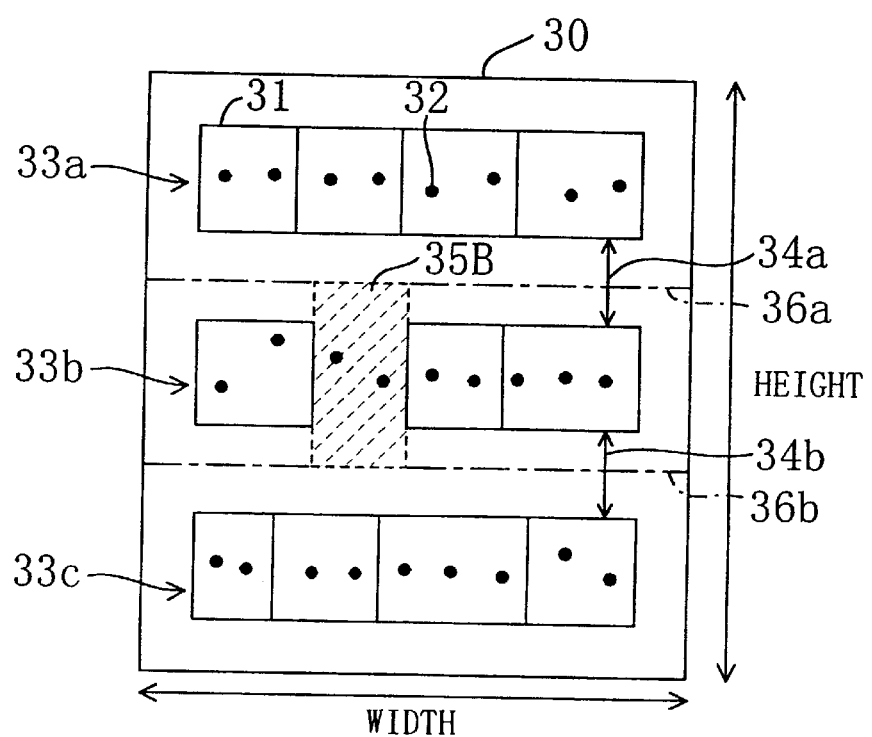

A specific example will be described with reference to FIGS. 4A and 4B. For example, a case of drawing boundary lines for the cell row 33b shown in FIG. 4A (hereinafter, simply referred to as "cell row boundary lines") will be considered. In such a case, first, cells having equivalent logic to that of each cell arranged on the row 33b are selected from the stretchable cell library 13. Then, a cell having a maximum height is chosen from the cells arranged on the row 33b and the cells selected from the stretchable cell library 13. Assume the result is that a cell 35B, having equivalent logic to that of a cell 35A arranged on the row 33b, has a maximum cell height. Then, the height of the cell 35B corresponds to the maximum cell row height of the row 33b. And, when the cell 35B is disposed on the row 33b, cell row boundary lines 36a and 36b for the row 33b are drawn on the upper and lower limits of the cell 35B as shown in FIG. 4B.

After the cell row boundary lines are defined for each row, the heights of the respective pure wiring regions are determined based on a predetermined minimum gap between cell rows.

It is noted that the pure wiring regions defined here can be used effectively as regions for wiring when inter-cell wiring is not completed only over the cells.

Figure 5A:
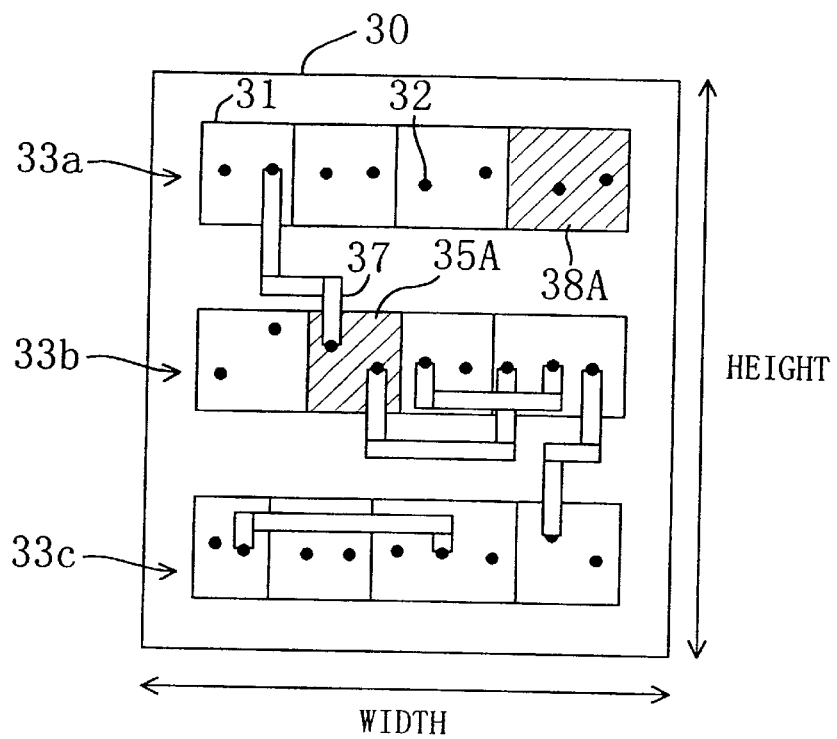
FIG. 5A and 5B are diagrams illustrating the first embodiment of the present invention.

Next, as shown in FIG. 1, the cells are wired based on the circuit designing information 12 in the routing processing S4. Wiring can be completed only over the cells by multilayer wiring technology using three or more layers. FIG. 5A is a diagram illustrating the results of the routing processing S4 performed on the layout shown in FIG. 4A in accordance with three-layer wiring technique. In FIG. 5A, the reference numeral 37 denotes wires. In the first on-cell wiring region R1 (see FIG. 3A) of each cell, inter-cell wiring is realized by using the second and third metal wiring layers. On the other hand, in the second on-cell wiring regions R2 (see also FIG. 3B) and in the pure wiring regions, inter-cell wiring is realized by using the first, second and third metal wiring layers. During this processing, the width and height of the block 30 do not change until the end of processing. It is noted that if wiring is not completed even by the use of the pure wiring regions provided through the pure wiring region providing processing S3, then the pure wiring regions are further expanded.

Next, in cell-in-question extraction processing S5, cells, each including a circuit section not satisfying the required specifications 11, are extracted as cells in question in the block layout designed through the arranging/routing processing S10. This processing S5 may be performed in a conventional manner. In FIG. 5A, cells in question are identified by hatching, showing that cells 35A and 38A are extracted as cells in question.

Then, in drivability calculation processing S6, the levels of drivability required for the cells in question, extracted through the cell-in-question processing S5, to satisfy the required specifications 11 are calculated. This processing may also be performed in a conventional manner.

Finally, in cell interchange processing S7, each of the cells in question, extracted through the cell-in-question extraction processing S5, is interchanged with a substitute cell in the stretchable cell library 13, such that the required specifications are satisfied and the wiring delay does not change substantially for the block layout designed through the arranging/routing processing S10. The substitute cell has equivalent logic to that of the cell in question, the same level of drivability as that calculated through the drivability calculation processing S6 and the same width and terminal position as the counterparts of the cell in question.

Figure 5B:
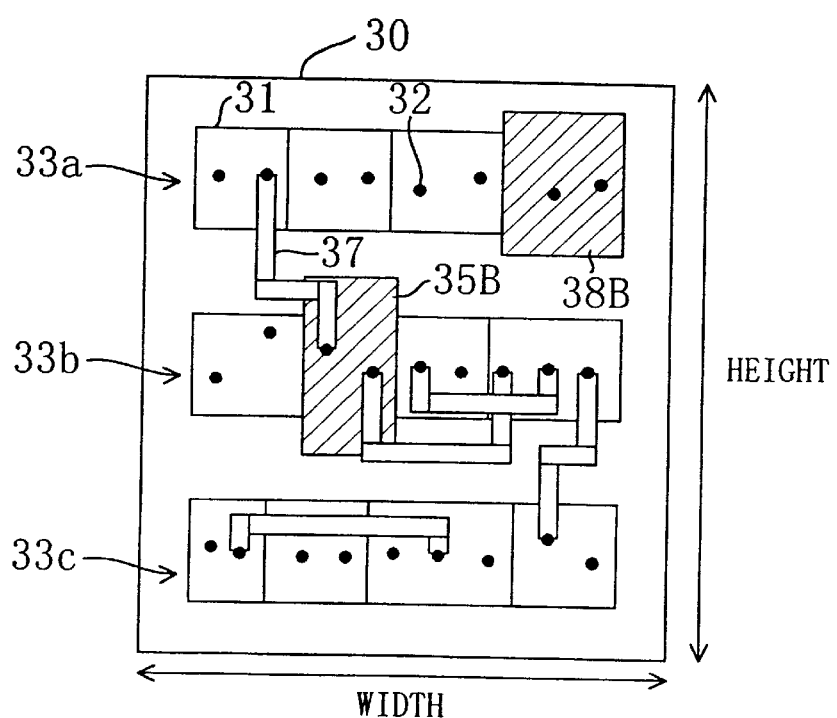

FIG. 5B is a diagram illustrating the results of cell interchange processing S7 performed on the block layout shown in FIG. 5A. As shown in FIG. 5B, the cells 35A and 38A in question are interchanged with cells 35B and 38B. In this case, the widths and terminal positions of the cells do not change before and after the cell interchange. Thus, as can be understood, the wiring is totally the same in FIGS. 5A and 5B. That is to say, the lengths of the wires and the positional interrelation among the wires remain the same even after the cell interchange processing S7 has been performed. As a result, an accurate operating timing can be ensured for an LSI.

If no cell is found to have required drivability in the stretchable cell library 13, another cell having equivalent logic to that of the cell in question and required drivability may be laid out under the conditions that the widths and terminal positions of these cells do not change. When the conditions are totally met, the cell in question may be interchanged with the newly designed cell.

As is apparent from the foregoing description, in accordance with the LSI layout designing method of the present invention, the wiring does not change at all even if cells are interchanged to satisfy the required specifications. As a result, re-routing processing is no longer necessary and the ring delay time remains the same.

Figure 6:
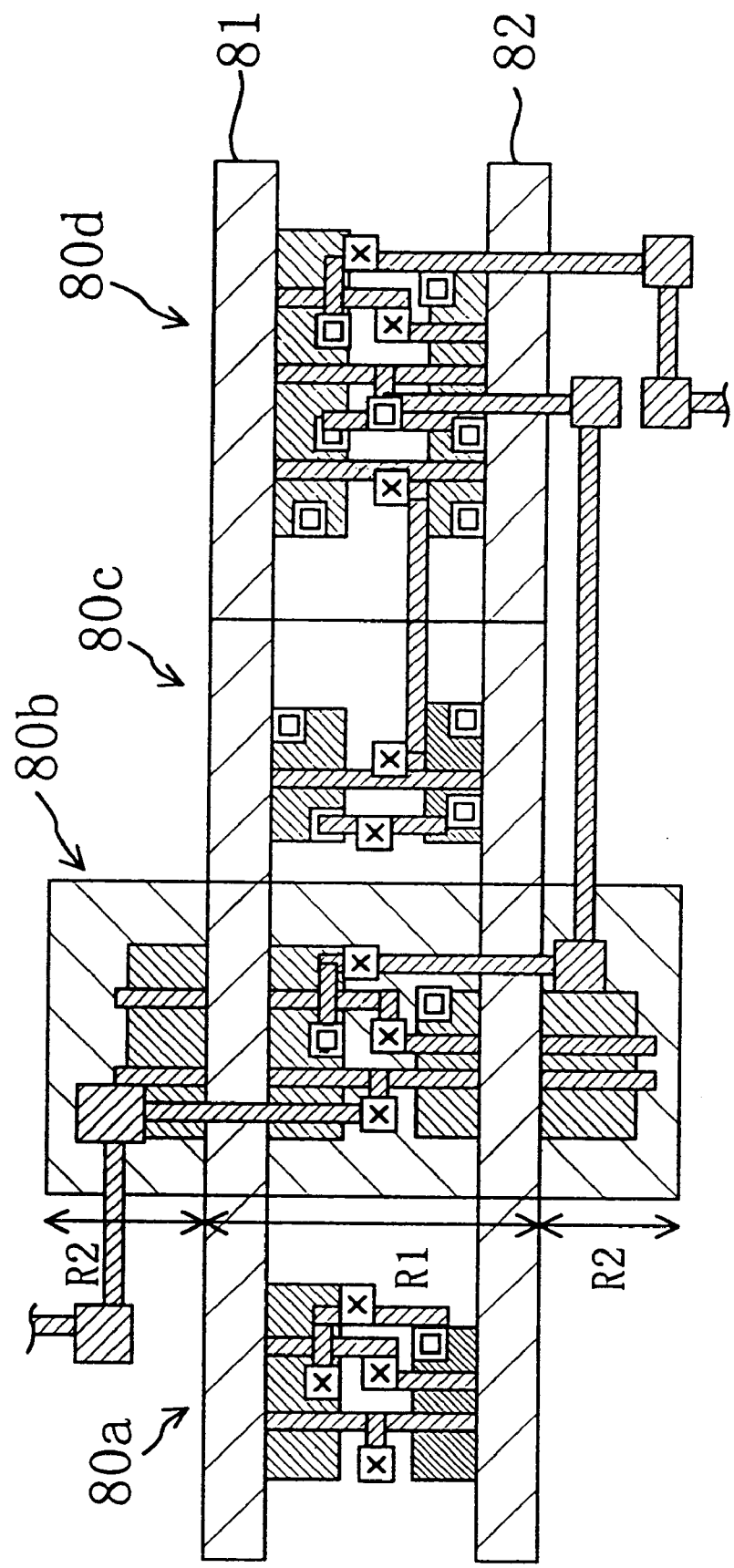
FIG. 6 is a plan view illustrating an exemplary semiconductor integrated circuit designed in accordance with the LSI layout designing method in the first embodiment of the present invention.

FIG. 6 is a plan view illustrating an exemplary semiconductor integrated circuit designed in accordance with the LSI layout designing method in the first embodiment of the present invention. FIG. 6 shows only a portion associated with a single cell row. As shown in FIG. 6, a plurality of cells 80a, 80b, 80c and 80d are arranged along a pair of power lines 81 and 82. The cell 80b is formed so as to cover the region between the lines 81 and 82 and the regions outside of the region between the lines 81 and 82. The intra-cell wiring of the cell 80b is formed only of the first metal wiring layer in the first on-cell wiring region R1, while the first metal wiring layer in the second on-cell wiring regions R2 is used for inter-cell wiring.

Embodiment 2

FIG. 7 is a flow chart illustrating a processing procedure of an LSI layout designing method in the second embodiment of the present invention. The basic processing flow of the LSI layout designing method of the second embodiment is the same as that of the first embodiment. But the second embodiment is different from the first embodiment in that the pure wiring region providing processing S3 is not performed during the arranging/routing processing S11 and that wiring compaction processing us is performed after the cell interchange processing S7 has been performed.

The input processing S1 is performed in the same way as in the first embodiment. During this processing, the required specifications 11, the circuit designing information 12 and the stretchable cell library 13 are input.

Next, the arranging/routing processing S11 is performed. The arranging/routing processing S11 of this embodiment does not include the pure wiring region providing processing S3 but consist of the arrangement processing S2 and the routing processing S4, which are performed in the same way as in the first embodiment. The arranging/routing processing S11 of the second embodiment is characterized in that the pure wiring regions are provided only when inter-cell wiring is not completed only over the cells.

As in the first embodiment, the cell-in-question extraction processing S5 and the drivability calculation processing S6 may also be performed in conventional manners.

Figure 8A:
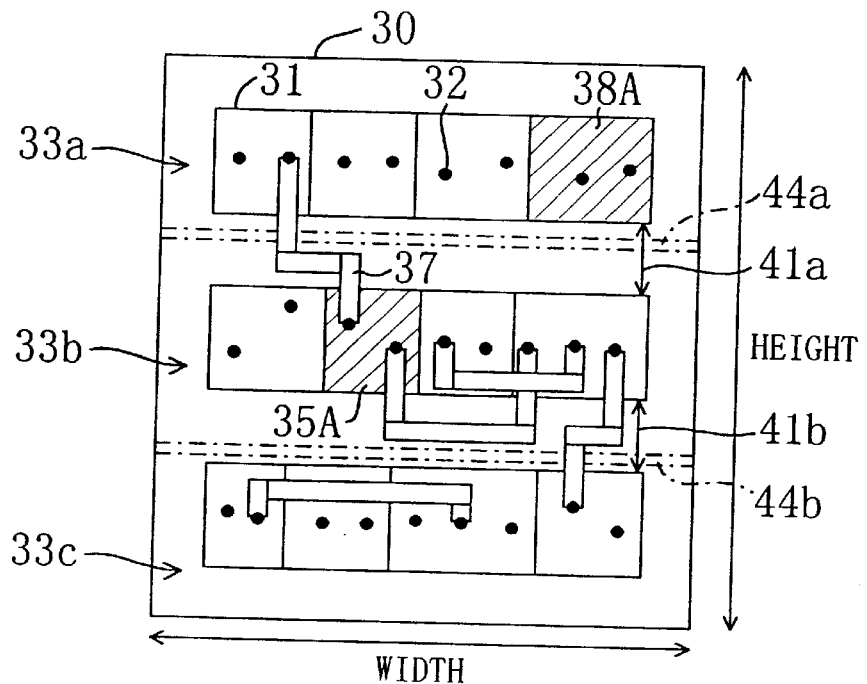
FIGS. 8A and 8B are diagrams illustrating the second embodiment of the present invention.

FIG. 8A is a diagram illustrating an exemplary block layout designed through the arranging/routing processing S11 of the second embodiment. As shown in FIG. 8A, within the block 30, three rows 33a, 33b and 33c, each including a plurality of cells 31, are arranged and pure wiring regions 41a and 41b are provided between the rows 33a and 33b and between the rows 33b and 33c, respectively. In FIG. 8A, cells in question are identified by hatching, showing that cells 35A and 38A are extracted as cells in question.

The cell interchange processing S7 is also performed in the same way as in the first embodiment. That is to say, each of the cells in question, extracted through the cell-in-question extraction processing S5, is interchanged with a cell having equivalent logic, the same level of drivability as that calculated through the drivability calculation processing S6 and the same width and terminal position.

In this embodiment, the wiring compaction processing S8 is performed after the cell interchange processing S7 has been performed. The wiring compaction processing S8 includes both the compression and expansion of the wires. In the wiring compaction processing S8, the gap between adjacent cell rows is adjusted based on the results of the cell interchange processing S7 and the wires located in the gap between the rows are vertically expanded/compacted in accordance with the adjustment of the gap between the rows.

Figure 9A:
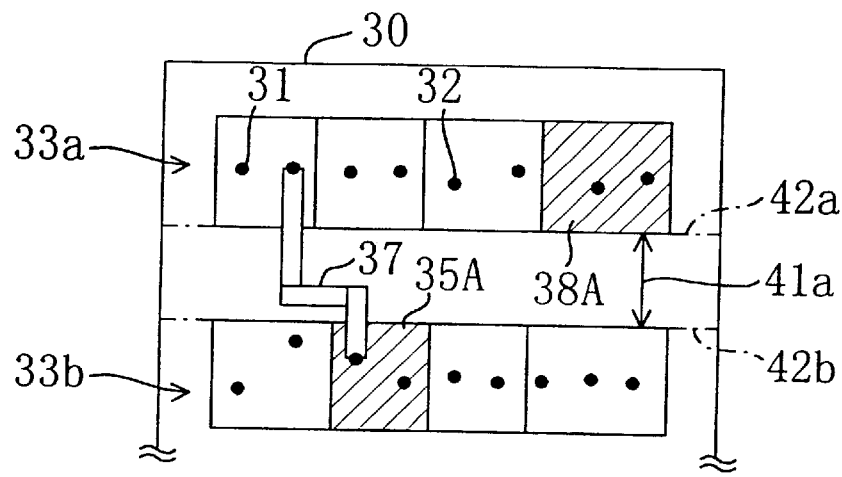
FIGS. 9A through 9C are diagrams illustrating the wiring compaction processing S8 in the second embodiment of the present invention, and illustrating how a wire is compacted in the peripheral regions of cell rows 33a and 33b in the block layout shown in FIG. 7A.

A case requiring the wiring compaction will be described with reference to FIGS. 9A to 9C. In FIG. 9A, a portion including the rows 33a and 33b is extracted and shown from the block layout shown in FIG. 8A. As shown In FIG. 9A, wiring is not completed only over the cells and is realized by using the pure wiring region 41a. The pure wiring region 41a is a region always required for wiring irrespective of whether the height of a cell is increased or decreased as a result of the cell interchange processing S7.

If the height of a cell is increased as a result of the cell interchange processing S7, the height of the transistors laid out in the cell increases in the cell height direction. Consequently, some design rule error like transistor overlapping or too close arrangement is sometimes caused in the gap between vertically adjacent cell rows.

In order to control the design rule error with ease, the cell row boundary lines representing the upper and lower limits of a cell row are utilized. In FIG. 9A, the reference numeral 42a denotes a cell row boundary line representing the lower limit of the cell row 33a and the reference numeral 42b denotes a cell row boundary line representing the upper limit of the cell row 33b.

Figure 9B:
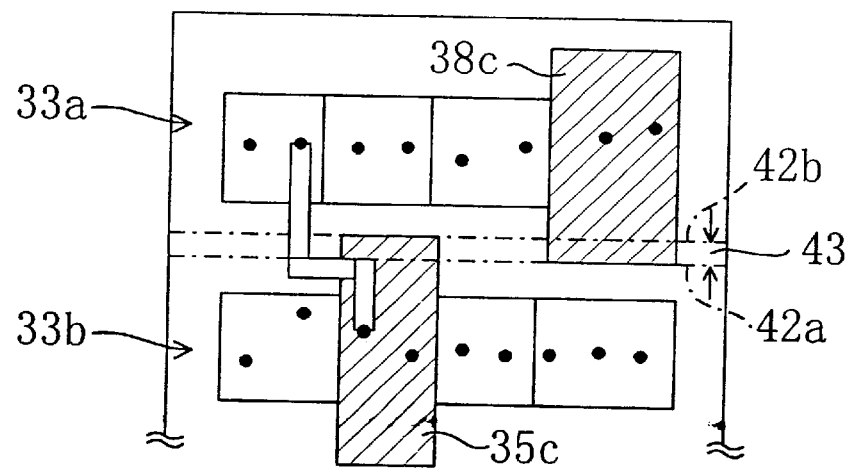

Assume the cells 35A and 38A in question have respectively been interchanged with cells 35C and 38C as a result of the cell interchange processing S7, as shown in FIG. 9B.

Consequently, as shown in FIG. 9B, the vertical positional relationship between the cell row boundary line 42a representing the lower limit of the cell row 33a and the cell row boundary line 42b representing the upper limit of the cell row 33b is reversed. That is to say, the cell row boundary line 42a representing the lower limit of the row 33a becomes lower than the cell row boundary line 42b representing the upper limit of the row 33b. In such a case, it is determined that some design rule error is possibly caused between the vertically adjacent rows 33a and 33b. And the interval 43 between the cell row boundary lines 42a and 42b is defined as a compaction distance.

In the wiring compaction processing S8, wiring compaction regions 44a and 44b, which are parallel to the rows intersecting only the wires vertical to the rows, are provided for the pure wiring regions 41a and 41b before the cells are interchanged as shown in FIG. 8A. And, if it is determined that some design rule error is possibly caused as a result of the cell interchange, the wiring compaction regions 44a and 44b are expanded by the compaction distances in the block height direction. As a result, the pure wiring regions 41a and 41b and the wires, intersecting with the wiring compaction regions 44a and 44b and vertically extending to the rows, are also expanded by the compaction distances in the block height direction.

Figure 8B:
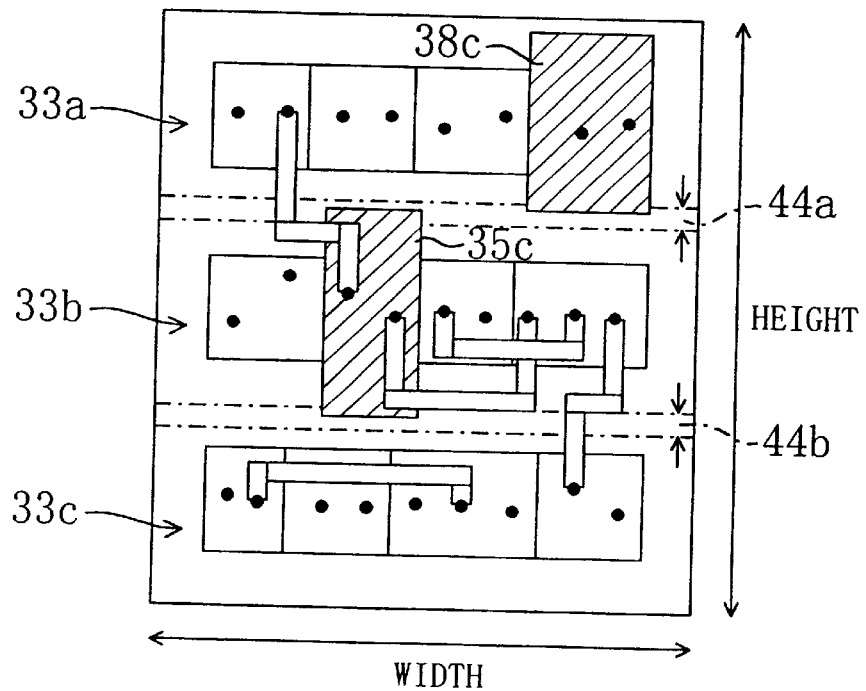
Figure 9C:
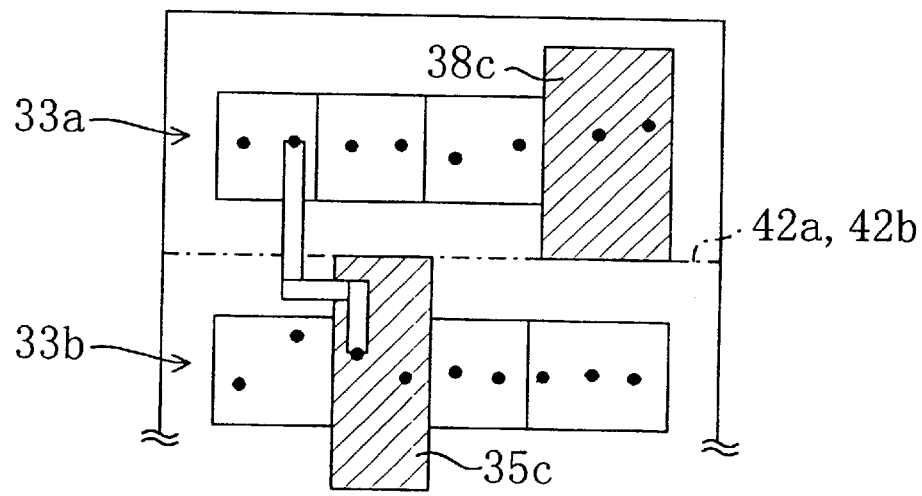

FIG. 9C is a diagram showing the results of the above-described processing performed on the layout shown in FIG. 9B. Also, FIG. 8B is a diagram showing the results of the above-described processing performed on the layout shown in FIG. 8A, which processing is also performed on the gap between the cell rows 33b and 33c in the same way. As shown in FIG. 8B, the gap between the rows 33a and 33b is expanded by the compaction distance as a result of the expansion of the wiring compaction region 44a in the block height direction. Similarly, the gap between the rows 33b and 33c is also expanded by the compaction distance as a result of the expansion of the wiring compaction region 44b in the block height direction. As a result, the layout shown in FIG. 8B has the same block width as that of the layout shown in FIG. 8A but has an increased block height than that shown in FIG. 8A.

As can be understood from FIGS. 8A and 8B, the shapes of the wires remain the same before and after the wiring compaction processing S8 of the second embodiment. In other words, as a result of the wiring compaction processing S8 of the second embodiment, the wires are expanded to a certain extent in the vertical direction, but the positional interrelation among the wires does not change.

It is noted that since the wires are expanded in the vertical direction as a result of the wiring compaction processing S8 the wiring length and the wiring capacitance of an LSI are varied. Normally, such variations are minimal and hardly affect the operational characteristics of the LSI. However, as the case may be, the LSI possibly fails to satisfy the required specifications 11 because of the change. In order for the LSI to satisfy the required specifications 11 with more certainty, the cell-in-question extraction processing S5 needs to be performed again after the wiring compaction processing S8 has been performed. If no cells in question are extracted during the processing S5, the cell-in-question extraction processing S5 may be finished. On the other hand, if any cell in question is extracted, the drivability calculation processing S6, the cell interchange processing S7 and the wiring compaction processing S8 may be performed again as described above.

Variation 1 of Embodiment 2

In the second embodiment, a case where a gap between caused because of the increase in height of a cell row as a result of the cell interchange processing S7 has been described. However, as mentioned in the "Background" section, the sizes of transistors included in a cell are sometimes preferably reduced through the cell interchange processing S7. In this variation, a gap between cell rows is narrowed through the wiring compaction processing S8 when the height of a cell row is decreased as a result of the cell interchange processing S7.

Figure 10A:
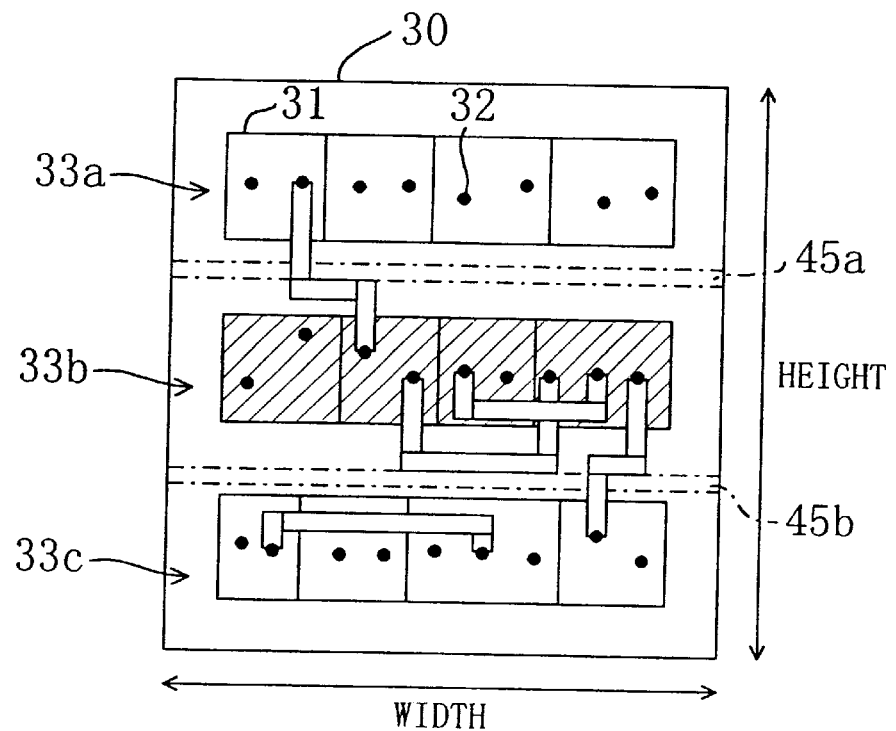
FIGS. 10A and 10B are diagrams illustrating a first variation of the second embodiment of the present invention.

FIG. 10A is a diagram illustrating an exemplary block layout designed through the arranging/routing processing S11. In this variation, in order to reduce the power consumption of an LSI, the sizes of transistors included in a cell row 33b are supposed to be reduced through the cell interchange processing S7. And, in order to reduce the area of a block, the gap between cell rows is reduced through the wiring compaction processing S8 as much as possible so long as inter-cell wiring is enabled.

As shown in FIG. 10A, wiring compaction regions 45a and 45b, intersecting only with the wires vertical to the cell rows and extending in parallel to the cell rows, are provided beforehand between the rows 33a and 33b and between the rows 33b and 33c, respectively. And a compaction distance, by which the gap between the rows can be reduced, is obtained by using the cell row boundary lines in the same way as in the second embodiment. The wiring compaction regions 45a and 45b, and the wires, intersecting with the respective wiring compaction regions 45a and 45b and extending vertically to the cell rows, are vertically narrowed by the respective compaction distances.

Figure 10B:
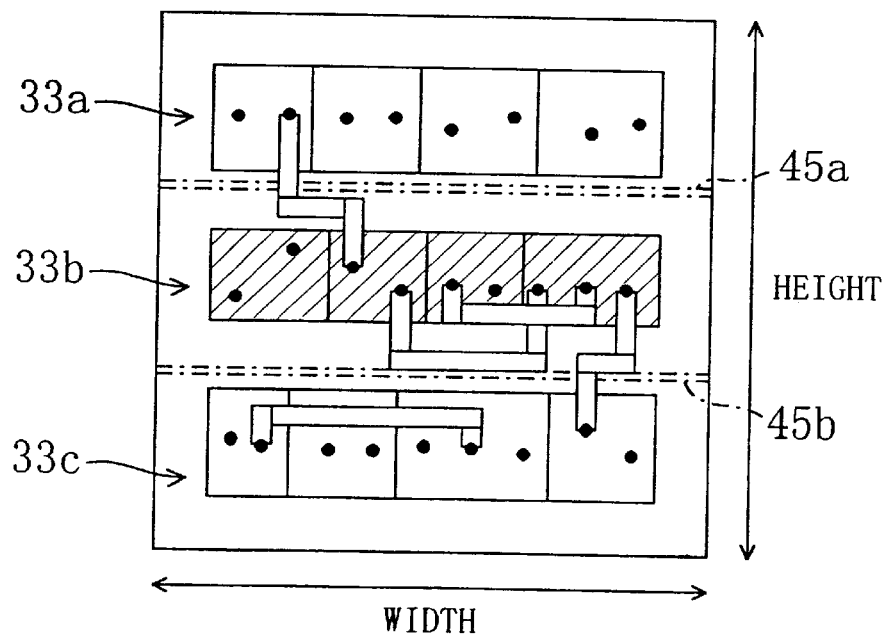

FIG. 10B is a diagram illustrating the results of the wiring compaction processing S8 of this variation performed on the block layout shown in FIG. 10A. As shown in FIG. 10B, the height of the cell row 33b has been decreased because a cell of the row 33b has been interchanged with a cell including transistors of a smaller size. In addition, since the wiring compaction region 45a has been narrowed, the gap between the cell rows 33a and 33b has also been narrowed. In the same way, since the wiring compaction region 45b has been narrowed, the gap between the cell rows 33b and 33c has also been narrowed. As a result, the layout shown in FIG. 10B has the same block width as that of the layout shown in FIG. 10A, but has a decreased block height than that of the layout shown in FIG. 10A.

As can be understood from FIGS. 10A and 10B, the shapes of the wires remain the same before and after the wiring compaction processing S8 of this variation. In other words, as a result of the wiring compaction processing S8 of this variation, the wires are narrowed to a certain extent in the vertical direction, but the positional interrelation among the wires does not change.

Variation 2 of Embodiment 2

In the LSI layout designing method of this variation, timing requirements are imposed on a path as required specifications. A plurality of cells not satisfying the required specifications are extracted from the path as cells in question. And such a level of drivability as to minimize the block height is assigned to each of the cells in question. The basic flow of the processing is the same as that of the LSI layout designing method of the second embodiment shown in FIG. 7.

First, in the input processing S1, the required specifications 11, the circuit designing information 12 and the stretchable cell library 13 are input. In this variation, timing requirements are imposed on a path as the required specifications 11. Hereinafter, a path, on which the timing requirements have been imposed, will be referred to as a "critical path".

The arranging/routing processing S2 and the routing processing S4 are performed in the same way as in the second embodiment.

Next, through the cell-in-question extraction processing S5, cells on the path not satisfying the required specifications are extracted as cells in question. Herein, a critical path, on which a timing error has been generated, is detected and a plurality of cells on the path are extracted as cells in question. For example, all the cells on the critical path may be extracted.

Next, in the drivability calculation processing S6, an optimum level of drivability is assigned to each of the cells in question, which have been extracted through the cell-in-question extraction processing S5, such that the critical path satisfies the required specifications and that the block height is minimized.

Figure 11:
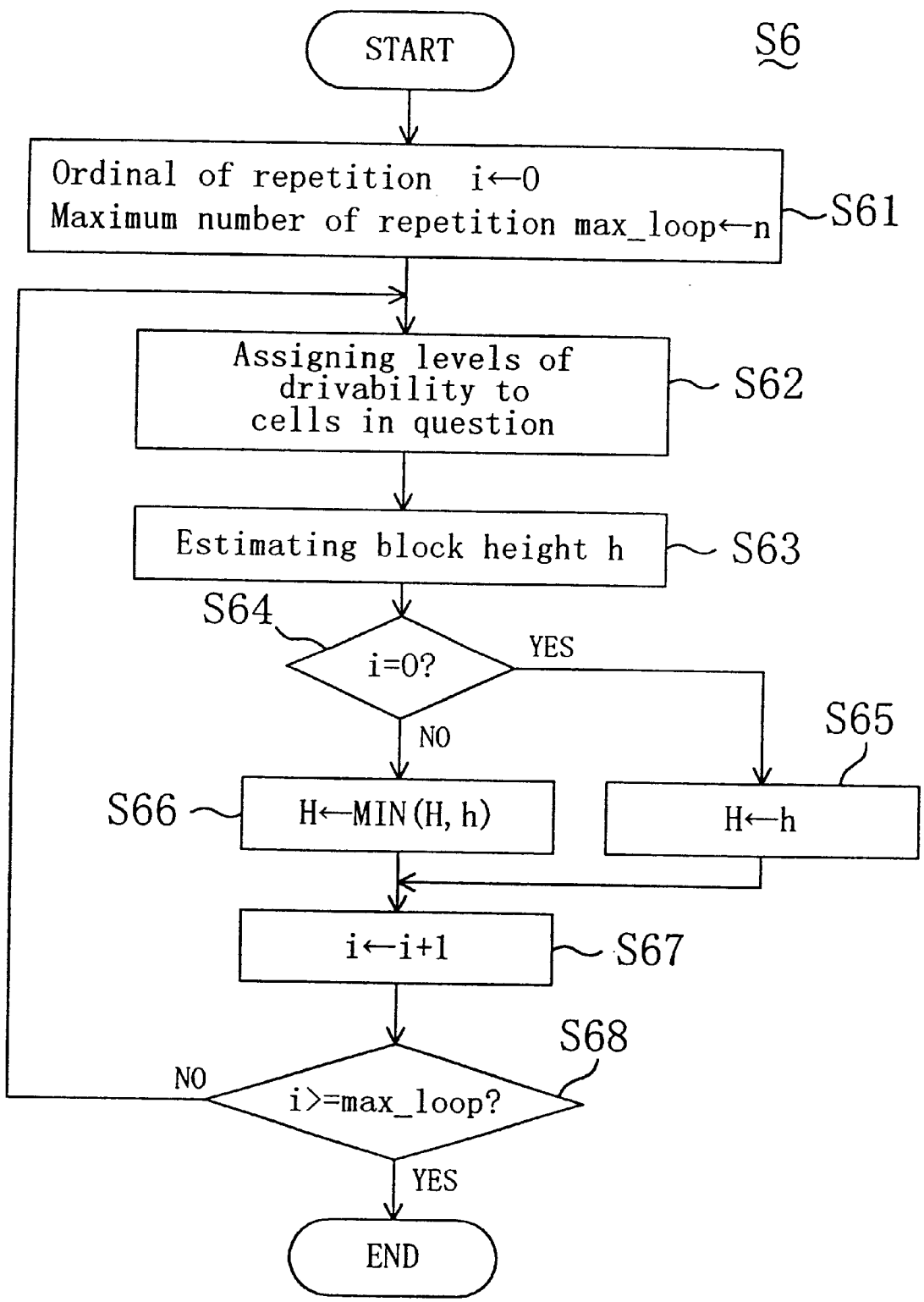
FIG. 11 is a flow chart illustrating a processing procedure of drivability calculation processing S6 in a second variation of the second embodiment of the present invention.

FIG. 11 is a flow chart illustrating the processing flow of the drivability calculation processing S6 in this variation. As shown in FIG. 11, first, the ordinal of repetition is initialized and the maximum number of repetition (i.e., how many times the steps S62 through S68 are repeatedly performed) is set in Step S61. Next, in Step S62, a level of drivability is assigned to each of the cells in question for the path to satisfy the required specifications. Then, in Step S63, the block height is estimated.

At the beginning of the repetition, i.e., if the ordinal of repetition is determined to be zero in Step S64, then a block height h is substituted for a minimum block height H. From the second repetition on, i.e., if the ordinal of repetition is determined to be non-zero in Step S64, then the smaller one of the block height h and the minimum block height H, which has been used until then, is substituted for the minimum block height H. Then, in Step S67, the ordinal of repetition is incremented by one. Next, in Step S68, if the ordinal of repetition is determined to be larger than the maximum number of repetition, then the processing is terminated. On the other hand, if it is determined otherwise in Step S68, the processing returns to Step S62.

Figure 12A:
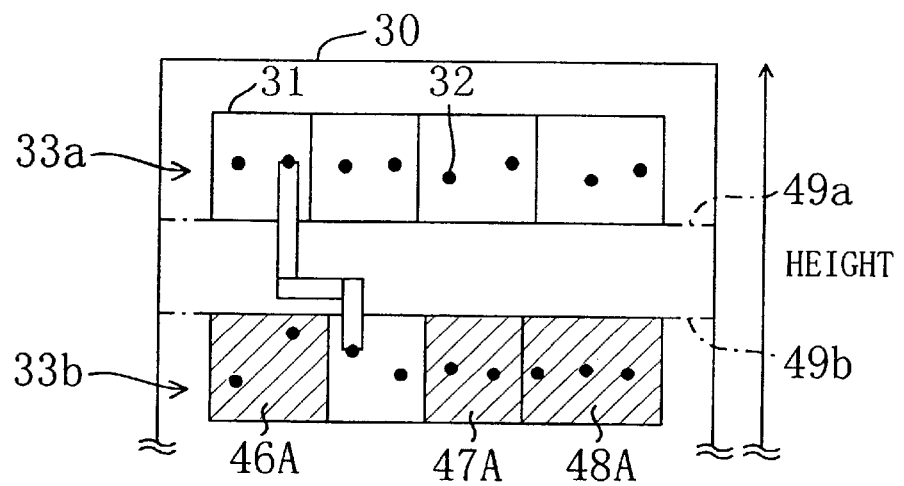
FIGS. 12A through 12C are diagrams illustrating the drivability calculating processing S6 in the second variation of the second embodiment of the present invention.

Hereinafter, this processing will be described more fully with reference to FIGS. 12A through 12C. FIG. 12A is a diagram illustrating an exemplary block layout before the drivability calculation processing S6 of this variation is performed. In the example shown in FIG. 12A, it is assumed that three cells 46A, 47A and 48A on a critical path, on which timing errors have been caused, are extracted as cells in question as a result of the cell-in-question extraction processing 5. In FIG. 12A, the reference numeral 49a denotes a cell row boundary line representing the lower limit of the cell row 33a while the reference numeral 49b denotes a cell row boundary line representing the upper limit of the cell row 33b.

In Step S63, respective levels of drivability are assigned to the three cells 46A, 47A and 48A in question for the critical path, on which the timing errors have been generated, to satisfy the timing requirements.

Figure 12B:
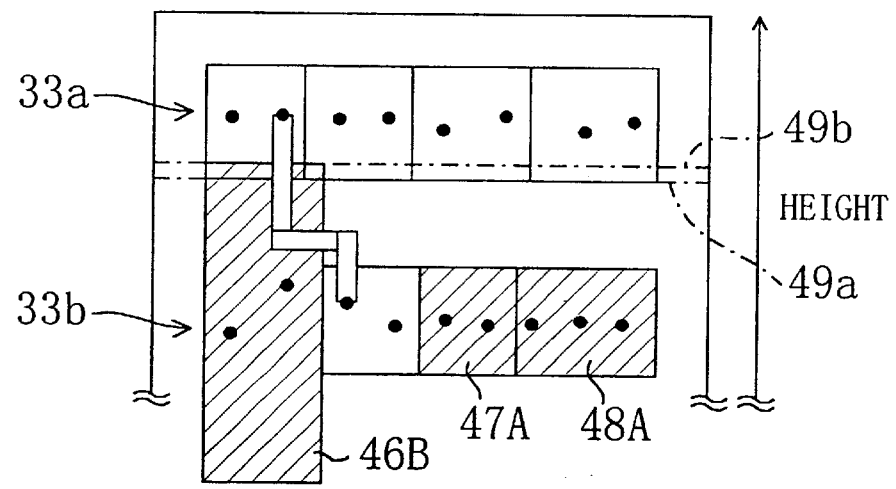

FIG. 12B is a diagram illustrating an exemplary layout in which respective levels of drivability are assigned to the respective cells 46A, 47A and 48A in question. In the example shown in FIG. 12B, the cell 46A is interchanged with a cell 46B having a size twice as large as that of the original cell and the two other cells 47A and 48A are not replaced, thereby making the critical path satisfy the timing requirements. In this case, the positional relationship between the cell row boundary line 49a representing the lower limit of the cell row 33a and the cell row boundary line 49b representing the upper limit of the cell row 33b is reversed. Thus, some design rule error is caused in the gap between the cell rows 33a and 33b unless the height of the gap between the vertically adjacent rows 33a and 33b in the pure wiring region is increased in the direction vertical to the cell rows. If such an error is caused, then the block height is increased.

Figure 12C:
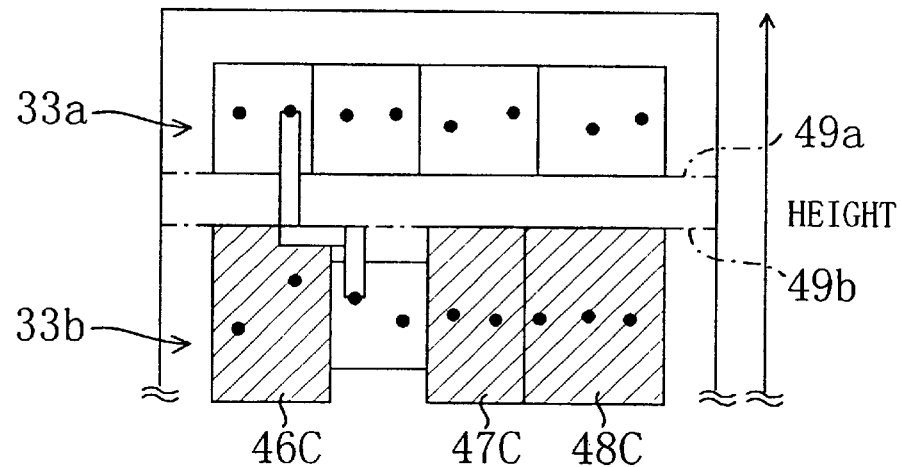

FIG. 12C is a diagram illustrating another exemplary layout in which respective levels of drivability are assigned to the cells 46A, 47A and 48A in question. In the example shown in FIG. 12C, the cells 46A, 47A and 48A are all interchanged with cells 46C, 47C and 48C having a level of drivability 1.3 times as high as the original one, thereby making the critical path satisfy the timing requirements. In such a case, the vertical positional relationship between the cell row boundary line 49a representing the lower limit of the cell row 33a and the cell row boundary line 49b representing the upper limit of the cell row 33b remains the same as that shown in FIG. 12A. Thus, the block height is not increased.

Accordingly, if there are two types of drivability assignment candidates shown in FIGS. 12B and 12C, then the assignment shown in FIG. 12C should be adopted.

The cell interchange processing S7 and the wiring compaction processing S8 are performed in the same way as in the second embodiment.

In the foregoing description, the basic processing flow is assumed to be the same as that of the second embodiment. Alternatively, this variation may also be implemented in combination with the first embodiment.

Variation 3 of Embodiment 2

In this variation, after the cell interchange processing S7 has been performed, power line width adjustment processing S9 is performed for adjusting the widths of the power lines in such a manner as to control the voltages supplied to the respective cells within a predetermined range.

Figure 13:
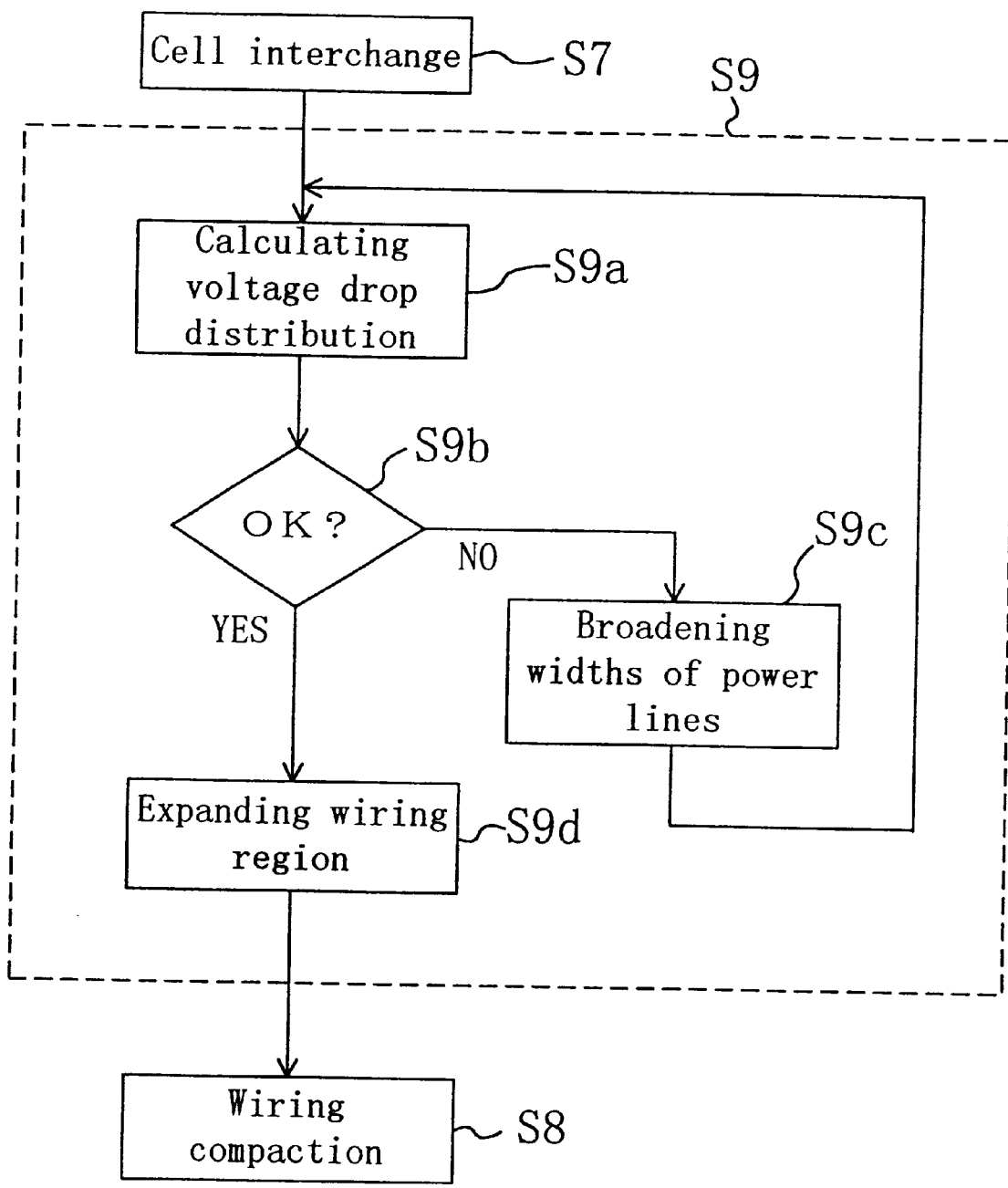
FIG. 13 is a flow chart illustrating a processing procedure of power line width adjustment processing S9 in a third variation of the second embodiment of the present invention.

FIG. 13 is a flow chart illustrating a processing flow of the power line width adjustment processing S9 of this variation. As shown in FIG. 13, first, the voltage drop distribution in the power supply line and the ground line is calculated in Step S9a, thereby obtaining the voltages to be supplied to the respective cells. Next, in Step 9b, it is determined whether or not the voltages supplied to the respective cells are within the predetermined range. If there is any cell, to which a voltage exceeding the range is supplied, then the widths of the power lines are broadened in Step S9c. After that, when all the voltages supplied to the respective cells are within the predetermined range, then the wiring region between adjacent cell rows is expanded by the increase of the width of the power supply lines in Step S9d.

First, in the arranging/routing processing S11, a data table describing the data for calculating the current consumed by the respective cells arranged in a block layout is produced. The following Table 1 is an exemplary data table.

TABLE 1

| Cell | i0 | p0 | C1 | C2 | C3 |
|------|-----|----|-----|----|----|
| A | 110 | 25 | p1 = 10<br>p2 = 12<br>p3 = 11 | 30 | 20 |
| B | 115 | 35 | p1 = 15<br>p2 = 15 | 30 | 20 |
| C | 220 | 15 | p1 = 20<br>p2 = 22<br>p3 = 21 | 80 | 40 |

In this table, current i0 consumed per single operation, operation probability p0 (i.e., the number of times of operation during a unit time period), input gate capacitance C1 of each terminal, internal capacitance C2 and output drain capacitance C3 are described for each cell shown in Table 1.

In the cell interchange processing S7, the data stored in this table is updated in accordance with the cell interchange. When the size of a transistor changes, the input-gate capacitance and output drain capacitance of the cell also change. Thus, if the cells are interchanged, the values of input gate capacitance and output drain capacitance described in the data table should be updated correspondingly.

Figure 14A:
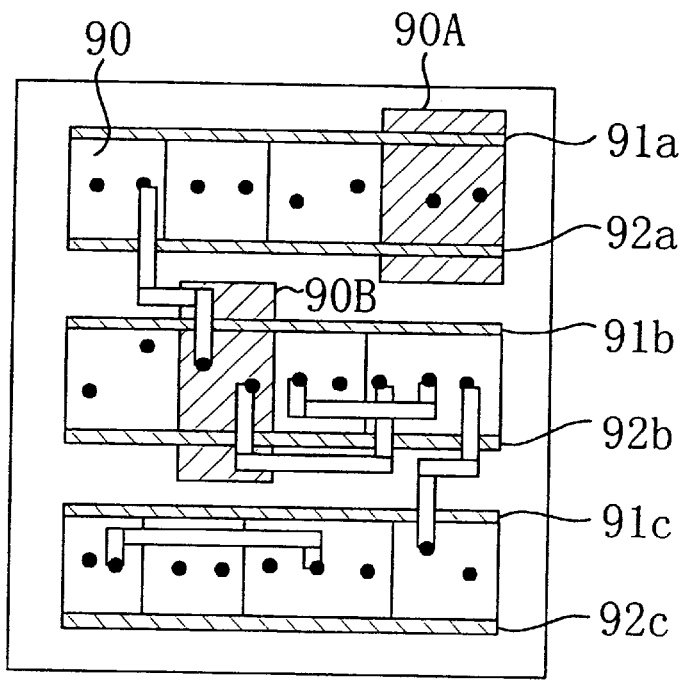
FIGS. 14A and 14B are diagrams illustrating how the voltage drop distribution is calculated in the power line width adjustment processing S9 in the third variation of the second embodiment of the present invention.
Figure 14B:
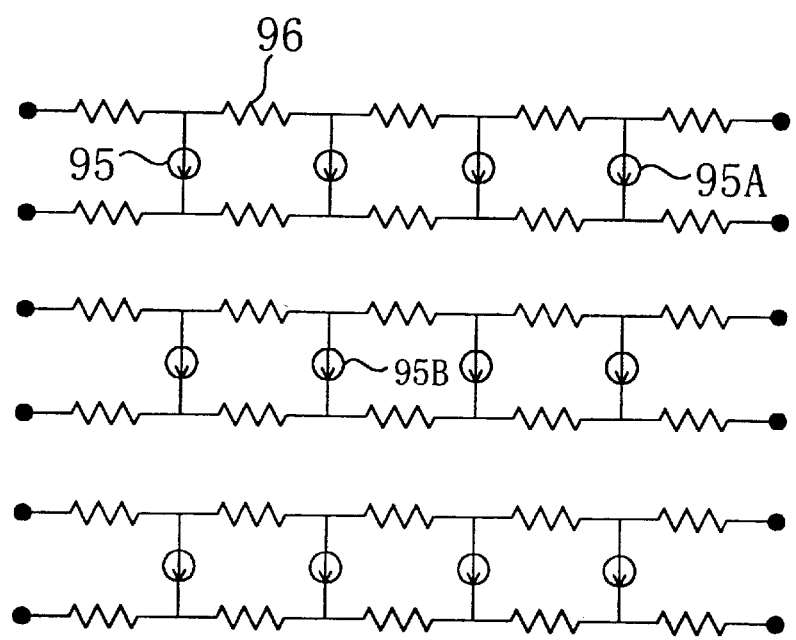

Next, the power line width adjustment processing S9 is performed. FIGS. 14A and 14B are diagrams illustrating how the voltage drop distribution is calculated in Step S9a. FIG. 14A is a diagram illustrating a block layout after the cell interchange processing S7 has been performed, while FIG. 14B is a diagram illustrating a circuit model used for analyzing the voltage drop corresponding to the layout shown in FIG. 14A. In FIG. 14A, the reference numeral 90 denotes cells, 91a, 91b and 91c denote power supply lines, 92a, 92b and 92c denote ground lines, and 90A and 90B denote cells that have been substituted through the cell interchange processing S7. In FIG. 14B, current sources 95 correspond to the respective cells 90. For example, a current source 95A corresponds to the cell 90A and a current source 95B corresponds to the cell 90B. The reference numeral 96 denotes a resistance model representing the distribution of resistance values in the power supply lines 91a, 91b and 91c or in the ground lines 92a, 92b and 92c.

First, in Step S9a, the current P consumed by the respective cells is calculated by the following equation based on the data table as shown in Table 1.

$$P = p0 * (i0 + Cs) \qquad (2)$$

where Cs is a sum of the wiring capacitance of the wire connected to the output of the cell and the input gate capacitance of another cell connected to the output of the cell.

Then, by using the circuit model shown in FIG. 14B, the voltage drop distribution on the power lines is calculated. The resistance values of the respective resistance models 96 are determined based on the lengths and widths of the power supply lines 91a, 91b and 91c and the ground lines 92a, 92b and 92c. And, based on the calculation results, the voltages supplied to the respective cells 90 are obtained.

Then, in Step S9b, it is determined whether or not the voltages supplied to the respective cells are within the predetermined range. If there is any cell, to which a voltage exceeding this predetermined range is supplied, then the widths of the power lines for the row including the cell in question is broadened in Step S9c. In this case, the widths of the power lines are supposed to be broadened only outward as viewed from the cell. In the region between the power supply line and the ground line, the intra-cell wiring is formed in the first metal wiring layer, in which the power supply lines and ground lines are formed. Thus, it is necessary to prevent the intra-cell wiring from coming into contact with the power supply line or the ground line. However, when the widths of the lines are broadened, care should be taken to prevent the inter-cell wiring formed in the first metal wiring layer from coming into contact with the power supply line or the ground line.

Then, in Step S9d, the wiring region is expanded by the increments of the widths of the power lines, and the lengths of the wires in the vertical direction are also extended in this wiring region. Thereafter, in the same way as in the second embodiment, the wiring compaction processing S8 is performed.

In the foregoing embodiments and variations of the present invention, a stretchable cell library 13, in which cells are provided with such a cell layout that the cells, having equivalent logic and different levels of drivability, have the same widths and terminal positions, is prepared beforehand. Alternatively, in the cell interchange processing S7, a cell having equivalent logic to that of a cell in question, the same width and terminal position as the counterparts of the cell and a required level of drivability may be automatically synthesized when it is necessary.

In the first and second embodiments of the present invention, the cell row boundary line is supposed to be linear. However, even by the use of a cell row boundary line having such a folded shape as to follow the shapes of the respective cells arranged on a row, the same effects can also be attained.

The LSI layout designing method of the present invention may be implemented by an apparatus including a computer for executing the programs to carry out the method. Also, the method of the present invention may also be implemented by recording the programs for carrying out the method in a computer readable recording medium and by making a computer execute the programs recorded in the recording medium.

Figure 15:
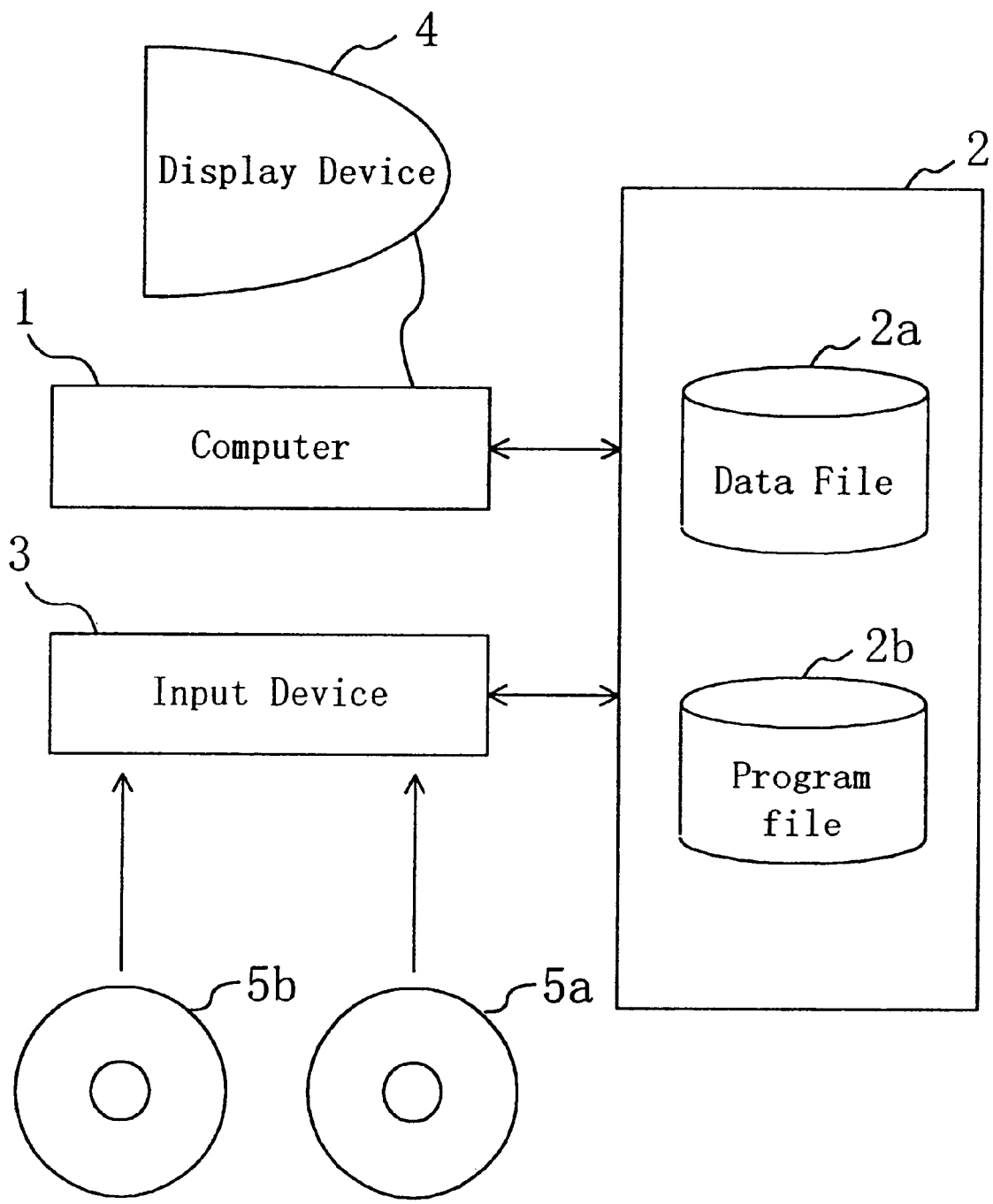
FIG. 15 is a block diagram illustrating an exemplary construction of an LSI layout designing apparatus of the present invention.
Figure 16:
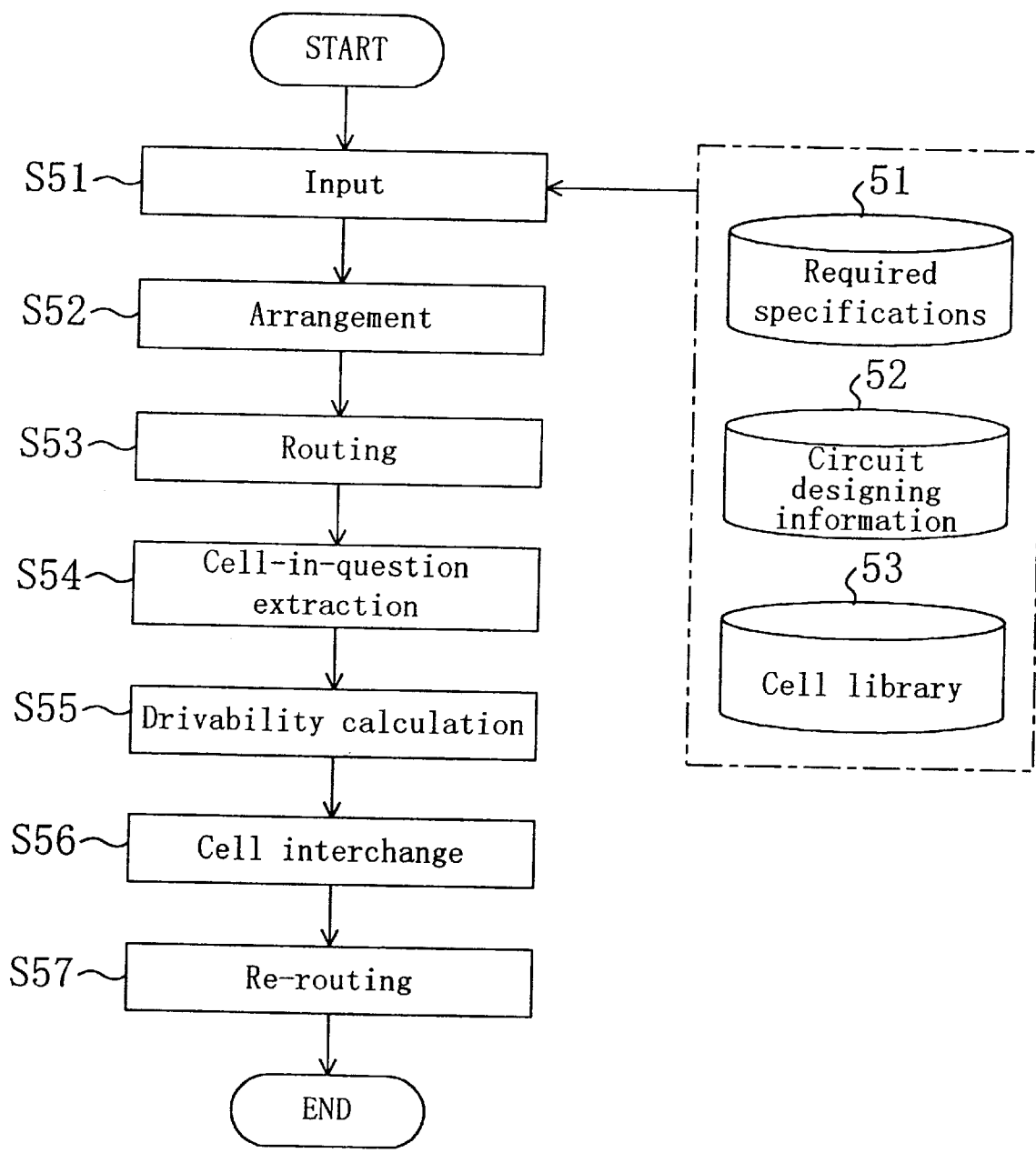
FIG. 16 is a flow chart illustrating the processing flow of a conventional LSI designing method.
Figure 17:
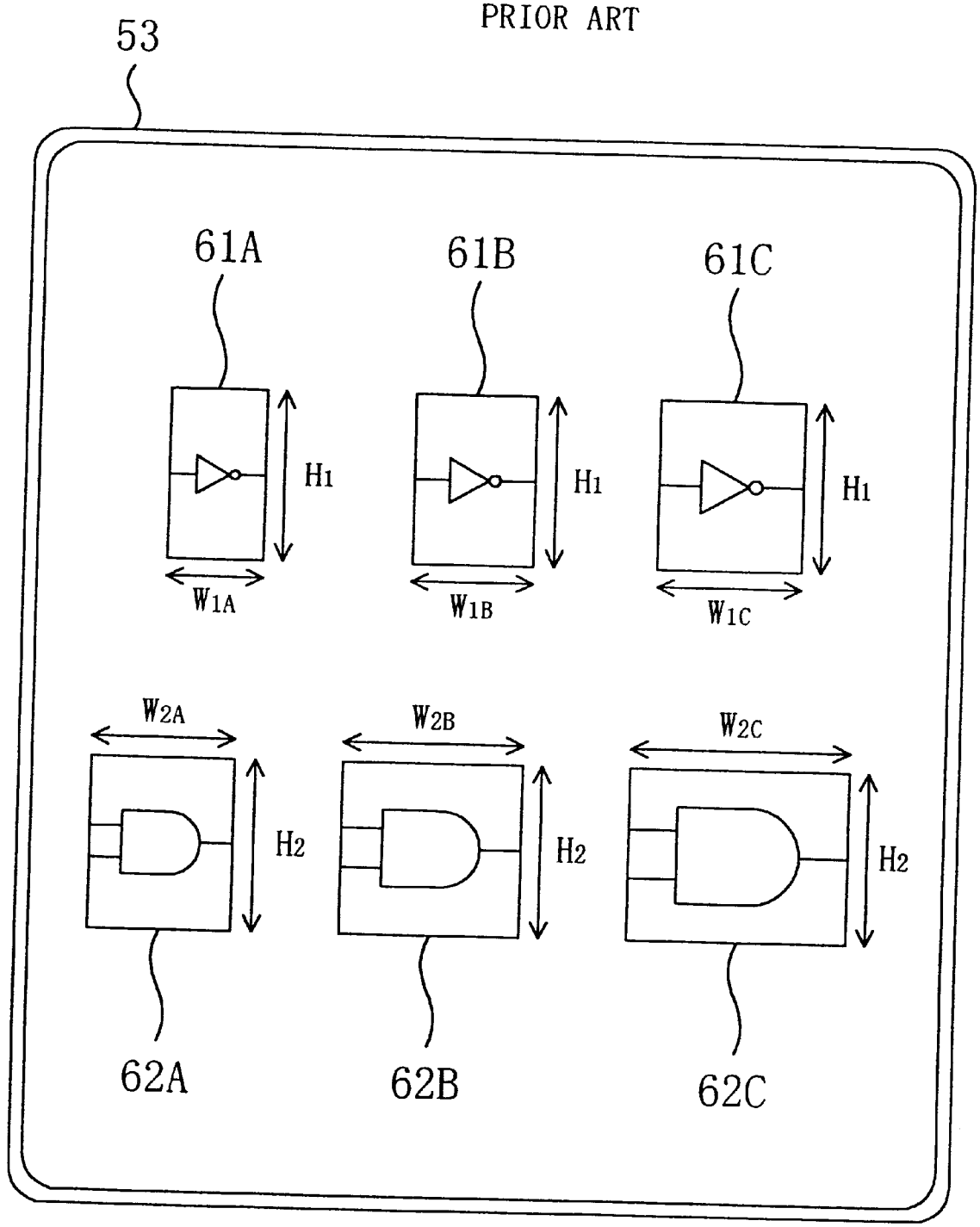
FIG. 17 is a schematic representation diagrammatically illustrating a cell library for use in a conventional LSI layout designing method.
Figure 18A:
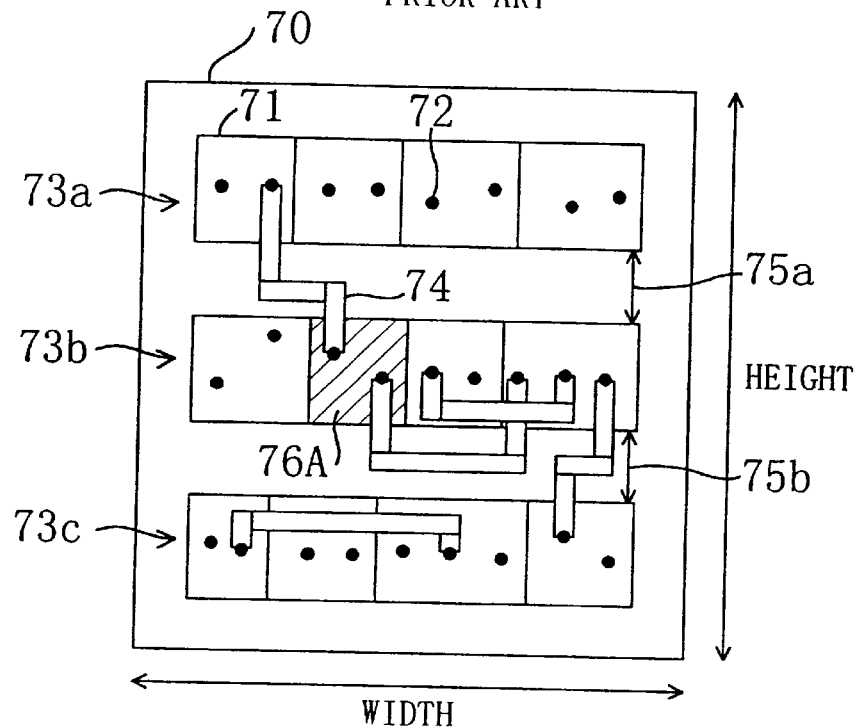
FIGS. 18A and 18B are diagrams illustrating a conventional LSI layout designing method.
Figure 18B:
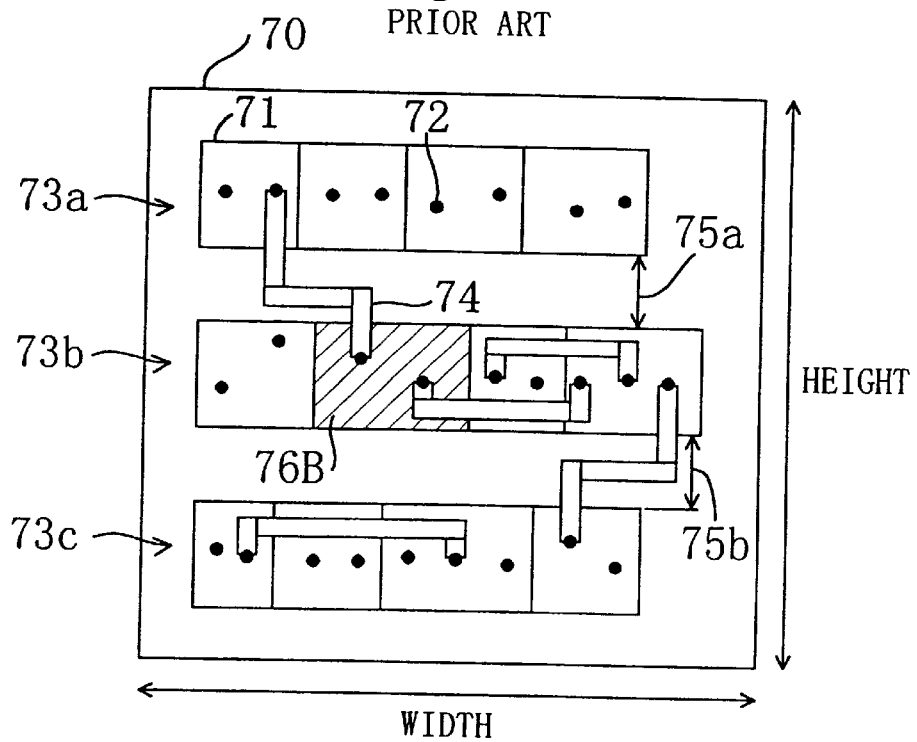

FIG. 15 is a block diagram illustrating an exemplary construction of an LSI layout designing apparatus according to the present invention. A computer 1 executes programs for implementing the LSI layout designing method of the present invention stored in a program file 2b of a storage device 2. The programs for implementing the LSI layout designing method of the present invention may be recorded in a computer readable recording medium such as a CD-ROM 5a. The programs recorded in the recording medium may be stored through an input device 3 into the storage device 2 so as to be executed by the computer 1. Also, the stretchable cell library 5b of the present invention may also be recorded in a computer readable recording medium such as the CD-ROM 5a. The stretchable cell library 5b recorded in the recording medium may also be stored through the input device 3 into the storage device 2 before the programs of the present invention are executed.

What is claimed is:

1. A LSI layout designing method comprising the steps of:
arranging cells in parallel to one another based on circuit design information and routing the cells so as to form a block layout;
interchanging a cell in question included in the block layout with a substitute cell so as to satisfy required specifications,
the block layout including a plurality of cell rows arranged in parallel to each other,
wherein in the interchanging step, the cell in question is interchanged with the substitute cell by using a stretchable cell library as a cell library comprising a set of cells to be arranged,
wherein cells in the stretchable cell library, which have equivalent logic and different levels of drivability, being provided with such a cell layout that widths and terminal positions of the cells are equal to each other in a cell arrangement direction on each said cell row, and
wherein cell arrangement and routing is not performed after said cell interchange step.

2. A LSI layout designing method comprising the steps of:
arranging cells in parallel to each other based on circuit designing information and routing the cells, thereby designing a block layout including a plurality of cell rows;
extracting a cell, not satisfying required specifications, as a cell in question in the block layout designed through the arranging/routing step;
calculating a level of drivability required for the cell in question, extracted through the extracting step, to satisfy the required specifications; and
interchanging the cell in question with a substitute cell having equivalent logic to logic of the cell in question, the same level of drivability as the level calculated in the calculating step and the same width and terminal position in a cell arrangement direction on each said cell row as the cell in question has, in the block layout designed in the arranging/routing step,
wherein cell arrangement and routing is not performed after said cell interchange step.

3. The LSI layout designing method of claim 2, wherein in the interchanging step, the cell in question is interchanged with the substitute cell by using a stretchable cell library as a cell library comprising a set of cells to be arranged,
cells in the stretchable cell library, which have equivalent logic and different levels of drivability, being provided with such a cell layout that widths and terminal positions of the cells are equal to each other in the cell arrangement direction on each said cell row,
and wherein the arranging/routing step comprises a step of providing a pure wiring region between at least a pair of the cell rows in the designed block layout such that a design rule error is not generated if the cell in question is interchanged as a result of the interchanging step with the substitute cell in the stretchable cell library having equivalent logic and a different level of drivability and included in the stretchable cell library.

4. The LSI layout designing method of claim 2, further comprising a step of changing a gap between the cell rows based on a result of the cell interchange of the interchanging step and of expanding/compacting wires in the gap between the cell rows in a direction vertical to the cell arrangement direction on each said cell row in accordance with the change of the gap between the cell rows.

5. The LSI layout designing method of claim 2, wherein in the extracting step, a plurality of cells, located on a path not satisfying the required specifications in the block layout designed in the arranging/routing step, are extracted,
and wherein in the calculating step, respective levels of drivability are assigned to a plurality of cells in question, which have been extracted in the extracting step,
such that the path not satisfying the required specifications prior to said calculating step does satisfy the required specifications after said calculating step, and
such that a height of a block becomes minimum in a direction vertical to the cell arrangement direction of each said cell row.

6. The LSI layout designing method of claim 2, further comprising a step of adjusting widths of power lines for obtaining a voltage to be supplied to each said cell by calculating a voltage drop distribution in the power lines after the interchanging step has been performed and for broadening the widths of power lines for a row including a cell, to which a voltage exceeding a predetermined range is supplied.

7. The LSI layout designing method of claim 6, wherein in the arranging/routing step, a data table describing data used for calculating current consumed by each said cell arranged is produced,
and wherein in the interchanging step, the data table is updated in accordance with the cell interchange,
and wherein in the adjusting step, the voltage drop distribution in the power lines is calculated by using the data table.

8. The LSI layout designing method of claim 6, wherein in the adjusting step, the power lines are widened only to the opposite side of a cell.

9. A LSI layout designing apparatus comprising:
means for arranging cells in parallel to each other based on circuit designing information and for routing the cells, thereby designing information and for routing the cells, thereby designing a block layout including a plurality of cell rows;
means for extracting a cell, not satisfying required specifications, as a cell in question from the block layout designed by the arranging/routing means;
means for calculating a level of drivability required for the cell in question, extracted by the extracting means, to satisfy the required specifications; and
means for interchanging the cell in question with a substitute cell having equivalent logic to logic of the cell in question, the same level of drivability as the level calculated by the calculating means and the same width and terminal position in a cell width direction on each said row as the cell in question has, in the block layout designed by the arranging/routing means, wherein all cell arrangement and routing is performed prior to said cell interchange.

10. The LSI layout designing apparatus of claim 9, wherein a stretchable cell library is input as a cell library comprising a set of cells to be arranged, cells in the stretchable cell library, which have equivalent logic and different levels of drivability, being provided with such a cell layout that widths and terminal positions of the cells are equal in each other in a cell arrangement direction on each said row, and wherein the interchanging means interchanges the cell in question with the substitute cell by using the stretchable cell library, and wherein the arranging/routing means comprises means for providing a pure wiring region between at least a pair of the cell rows in the designed block layout such that a design rule error is not generated if the cell in question is inter-changed with the substitute cell having equivalent logic and a different level of drivability and being included in the stretchable cell library by the interchanging means.

11. The LSI layout designing apparatus of claim 9, further comprising means for changing a gap between the cell rows based on a result of the cell interchange obtained by the interchanging means and for expanding/compacting wires in the gap between the cell rows in a direction vertical to the cell arrangement direction on each said cell row in accordance with the change of the gap between the cell rows.

12. The LSI layout designing apparatus of claim 9, wherein the extracting means extracts a plurality of cells, located on a path not satisfying the required specifications in the block layout designed by the arranging/routing means, and wherein the calculating means assigns respective levels of drivability to the cells in question, which have been extracted by the extracting means, such that the path not satisfying the required specifications does satisfy the required specifications and that a height of a block becomes minimum in a direction vertical to the cell arrangement direction on each said row.

13. A computer readable recording medium recording a cell library comprising a set of cells to be arranged in rows for use in designing a LSI layout in accordance with standard cell processing by arranging the rows of cells in parallel to each other, the cell library being a stretchable cell library, in which cells having equivalent logic and different levels of drivability are provided with a layout such that the widths of the cells and terminal positions of the cells are equal to each other and heights of the cells are different from each other.

14. A computer readable recording medium recording a program for making a computer execute LSI layout designing, wherein the program makes the computer execute the procedures of:

arranging cells in parallel to each other based on circuit designing information and routing the cells, thereby designing a block layout including a plurality of cell rows;

extracting a cell, not satisfying required specifications, as a cell in question in the block layout designed through the arranging/routing step;

calculating a level of drivability required for the cell in question, extracted in the extracting procedure, to satisfy the required specifications; and interchanging the cell in question with a substitute cell having equivalent logic to the logic of the cell in question, the same level of drivability as the level calculated in the calculating procedure and the same width and terminal position in a cell arrangement direction on each said cell row as the cell in question has, in the block layout designed in the arranging/routing procedure, and wherein all cell arrangement and routing is performed prior to said cell interchange step.

15. A LSI layout designing method comprising the steps of:

arranging cells in parallel to each other based on circuit designing information and routing the cells, thereby designing a block layout including a plurality of cell rows;

extracting a cell, not satisfying required specifications, as a cell in question in the block layout designed through the arranging/routing step; and interchanging the cell in question with a substitute cell having equivalent logic to logic of the cell in question, said substitute cell having the same width and terminal position in a cell arrangement direction on each said cell row as the cell in question has, and having a higher drivability level, wherein cell arrangement and routing is not performed after said cell interchange step.

16. A LSI layout designing apparatus comprising:

means for arranging cells in parallel to each other based on circuit designing information and for routing the cells, thereby designing a block layout including a plurality of cell rows;

means for extracting a cell, not satisfying required specifications, as a cell in question from the block layout designed by the arranging/routing means; and means for interchanging the cell in question with a substitute cell having equivalent logic to logic of the cell in question, said substitute cell having the same width and terminal position in a cell width direction on each said row as the cell in question has, and having a higher drivability level, wherein cell arrangement and routing is not performed after said cell interchange step.

17. A LSI layout designing method comprising a step of interchanging a cell in question included in a block layout with a substitute cell so as to satisfy required specifications, the block layout including a plurality of cell rows arranged in parallel to each other and having been designed based on circuit designing information, wherein in the interchanging step, the cell in question is interchanged with the substitute cell by using a stretchable cell library as a cell library comprising a set of cells to be arranged, wherein cells in the stretchable cell library, which have equivalent logic and different levels of drivability, being provided with such a cell layout that widths and terminal positions of the cells are equal to each other in a cell arrangement direction on each said cell row, and wherein at least two of said cells in the stretchable library have a different height dimension.

18. A LSI layout designing method comprising the steps of:

arranging cells in parallel to each other based on circuit designing information and routing the cells, thereby designing a block layout including a plurality of cell rows;

extracting a cell, not satisfying required specifications, as a cell in question in the block layout designed through the arranging/routing step;

calculating a level of drivability required for the cell in question, extracted through the extracting step, to satisfy the required specifications; and interchanging the cell in question with a substitute cell having equivalent logic to logic of the cell in question, the same level of drivability as the level calculated in the calculating step and the same width and terminal position in a cell arrangement direction on each said cell row as the cell in question has, in the block layout designed in the arranging/routing step, wherein at least two of said cells in the stretchable library have a different height dimension.

19. A LSI layout designing apparatus comprising:

means for arranging cells in parallel to each other based on circuit designing information and for routing the cells, thereby designing information and for routing the cells, thereby designing a block layout including a plurality of cell rows;

means for extracting a cell, not satisfying required specifications, as a cell in question from the block layout designed by the arranging/routing means;

means for calculating a level of drivability required for the cell in question, extracted by the extracting means, to satisfy the required specifications; and means for interchanging the cell in question with a substitute cell having equivalent logic to logic of the cell in question, the same level of drivability as the level calculated by the calculating means and the same width and terminal position in a cell width direction on each said row as the cell in question has, in the block layout designed by the arranging/routing means, wherein at least two of said cells in the stretchable library have a different height dimension.

* * * * *